(12) United States Patent
McKemey

(10) Patent No.: US 12,032,886 B2
(45) Date of Patent: *Jul. 9, 2024

(54) VERIFYING A HARDWARE DESIGN FOR A MULTI-STAGE COMPONENT

(71) Applicant: Imagination Technologies Limited, Kings Langley (GB)

(72) Inventor: Robert McKemey, Kings Langley (GB)

(73) Assignee: Imagination Technologies Limited, Kings Langley (GB)

( * ) Notice: Subject to any disclaimer, the term of this patent is extended or adjusted under 35 U.S.C. 154(b) by 0 days.

This patent is subject to a terminal disclaimer.

(21) Appl. No.: 17/990,518

(22) Filed: Nov. 18, 2022

(65) Prior Publication Data

US 2023/0085107 A1 Mar. 16, 2023

Related U.S. Application Data

(63) Continuation of application No. 17/135,146, filed on Dec. 28, 2020, now Pat. No. 11,520,958.

(30) Foreign Application Priority Data

Dec. 27, 2019 (GB) ...................................... 1919379

(51) Int. Cl.
*G06F 30/323* (2020.01)
*G06F 30/337* (2020.01)
*G06F 30/398* (2020.01)

(52) U.S. Cl.
CPC .......... *G06F 30/323* (2020.01); *G06F 30/337* (2020.01); *G06F 30/398* (2020.01)

(58) Field of Classification Search
CPC .. G06F 30/323; G06F 30/3323; G06F 30/337; G06F 30/398; G06F 2115/02
See application file for complete search history.

(56) References Cited

U.S. PATENT DOCUMENTS

| 10,346,571 B2 * | 7/2019 | Darbari | G06F 30/3323 |
| 11,520,958 B2 * | 12/2022 | McKemey | G06F 30/337 |
| 2016/0140281 A1 * | 5/2016 | Harer | G06F 30/33 716/109 |

FOREIGN PATENT DOCUMENTS

EP 1933245 A1 6/2008

OTHER PUBLICATIONS

Charvat et al; "Microprocessor hazard analysis via formal verification of parameterized systems"; Annual International Conference on the Theory and Applications of Cryptographic Techniques; URL: https://link.springer.com/chapter/10.1007%2F978-3-319-27340-2_75; 2015; pp. 605-614.

(Continued)

*Primary Examiner* — Jack Chiang
*Assistant Examiner* — Aric Lin
(74) *Attorney, Agent, or Firm* — Potomac Law Group, PLLC; Vincent M DeLuca

(57) ABSTRACT

Methods and systems for verifying a hardware design for a multi-stage component configured to receive input data and generate output data by processing the input data at each of a plurality of successive stages wherein each stage is independently enabled is stall independent. For each stage from the second stage to the last stage: a relevant portion of the output data of an instantiation of the hardware design is verified as the same if the instantiation is in the same state when that stage is enabled in a cycle by any set of inputs and any subsequent stages are enabled in subsequent cycles by a first minimal sequence of inputs. The relevant portion of the output data of the hardware design is verified as the same if the instantiation is in the same state (i) when that stage is enabled in a cycle and any subsequent stages are enabled in subsequent cycles by a second minimal sequence of inputs and (ii) when that stage is stalled, then that stage is enabled (Continued)

in the next cycle and the subsequent stages are enabled in subsequent cycles by the second minimal sequence of inputs.

19 Claims, 13 Drawing Sheets

(56) References Cited

OTHER PUBLICATIONS

Higgins et al; "Simplifying the design and automating the verification of pipelines with structural hazards"; ACM Transactions on Design Automation of Electronic Systems, vol. 10; No. 4; Oct. 2005; pp. 651-672.
Levitt et al; "A scalable formal verification methodology for pipelined microprocessors"; 1996; pp. 558-563.
Loitz et al; "Proving functional correctness of weakly programmable IPs—A case study with formal property checking"; Application Specific Processors; 2008; pp. 48-54.
Velev; "Using positive equality to prove liveness for pipelined microprocessors"; Design Automation Conference; 2004; pp. 316-321.
*Note: copies of above NPL document in parent apn.

* cited by examiner

VERIFYING A HARDWARE DESIGN FOR A MULTI-STAGE COMPONENT

CROSS-REFERENCE TO RELATED APPLICATIONS AND CLAIM OF PRIORITY

This application is a continuation under 35 U.S.C. 120 of copending application Ser. No. 17/135,146 filed Dec. 28, 2020, now U.S. Pat. No. 11,520,958, which claims foreign priority under 35 U.S.C. 119 from United Kingdom Application No. 1919379.6 filed Dec. 27, 2019.

BACKGROUND

Many electronic devices, such as systems-on-chips (SoCs), include one or more multi-stage components. A multi-stage component is a component that receives input data and generates output data therefor by processing the input data at each of a plurality of successive stages. Each of the plurality of stages may be implemented by a different set of hardware logic, or one or more of the plurality of stages may be implemented by the same hardware logic. For example, a first example two-stage component to implement (a+b)*4 may comprise two sets of hardware logic, wherein in the first stage the first set of hardware logic calculates a+b, and in the second stage the second set of hardware logic calculates the output of the first stage (i.e. a+b) multiplied by 4. A second example two-stage component to implement (a+b+4) may comprise a single set of hardware logic, wherein in the first stage the set of hardware logic calculates a+b and in the second stage the same hardware logic calculates the sum of the output of the first stage (a+b) and 4.

A multi-stage component is said to be stage-enabled if each stage is individually enabled by an external signal, which may be referred to herein as an enable signal. In a multi-stage component that is stage-enabled data moves through the component stage by stage stopping at each stage until the next stage is enabled by an enable signal.

An example multi-stage component 100 that is stage enabled is shown in FIG. 1. In this example the multi-stage component 100 comprises four stages 102, 104, 106, 108 each of which is enabled by a corresponding enable signal: $enable_0$, $enable_1$, $enable_2$, and $enable_3$. Input data moves through the component 100 stage by stage as each stage is enabled. For example, when stage zero 102 is enabled in a first cycle by $enable_0$, stage zero 102 processes the input data A to produce output data A0. If stage one 104 is subsequently enabled in the second cycle by $enable_1$ then the output of stage zero (A0) is processed by stage one 104 to produce output data A1. If stage two 106 is subsequently enabled in the third cycle by $enable_2$ then the output of stage one (A1) is processed by stage two 106 to produce output data A2. If stage three 108 is subsequently enabled in the fourth cycle by $enable_3$ then the output of stage two (A2) is processed by stage three 108 to produce output data A3. Although not explicitly shown in FIG. 1, each stage 102, 104, 106, 108 may be preceded by a set of one or more input registers which are read by that stage when that stage is enabled. For example, stage zero 102 may be preceded by a set of one or more input registers which are used to store the input data (e.g. A) for stage zero 102, and when stage zero 102 is enabled, stage zero 102 reads the data stored in the stage zero 102 input register(s), processes that data (e.g. A) to generate output data for stage zero (e.g. A0). The output data for stage zero (e.g. A0) is then stored in the input register(s) for stage one 104.

While in the example of FIG. 1 there are no stalls which occur during the processing of input data A, in other cases one or more of the stages may be stalled (i.e. not enabled) during the processing of input data A so that it takes longer that 4 cycles to process the input data A. When a stage is stalled (i.e. it is not enabled) that stage does not process new data. Accordingly, when a stage is stalled the output data for that stage remains the same (e.g. the data in the input register(s) for the following stage is not updated). For example, as shown in FIG. 2, if instead of stage three 108 being enabled in cycle 4 as in the example of FIG. 1, stage three 108 is not enabled until cycle 6. The enablement of stage three 108 in cycle 6 causes stage three 108 to process the output of stage two (A2) to produce output data A3'.

Generating a multi-stage component typically includes developing a hardware design that describes the structure and function of an integrated circuit that embodies the component; verifying or testing the hardware design to ensure that an integrated circuit manufactured according to the design will behave as expected; and once verified, manufacturing an integrated circuit, at an integrated circuit manufacturing system, in accordance with the hardware design.

Generally, a multi-stage component that is stage enabled should produce the same output data in response to the same input data regardless of the number and location of stalls that occur during the processing of the input data. For example, if the multi-stage component of FIGS. 1 and 2 is operating as expected, then for the same input data, the output data A3 in the example stalling scenario shown in FIG. 1 (i.e. no stalls) should be equal to the output data A3' in the example stalling scenario shown in FIG. 2 (i.e. two stalls of stage three 108 in clock cycles 4 and 5). Accordingly, verifying the operation, or behaviour, of a hardware design for a multi-stage component that is stage enabled may comprise verifying that the multi-stage component produces the same output data in response to the same input data regardless of the number and location of stalls that occur during the processing of the input data. This may be referred to herein as verifying the stall independence of the multi-stage component.

A hardware design may be verified, for example, by formal verification or simulation-based verification. Formal verification is a systematic process that uses a mathematical model of the hardware design and mathematical reasoning to verify the hardware design. In contrast, simulation-based verification is a process in which a hardware design is tested by applying stimuli to an instantiation of the hardware design and monitoring the output of the instantiation of the hardware design in response to the stimuli.

Formal verification is performed using a formal verification tool (i.e. a software tool that is capable of performing formal verification of a hardware design). Formal verification tools include, but are not limited to, formal model checkers (which also may be referred to as formal property checkers) such as OneSpin 360 DV™, Mentor Graphics Questa® Formal Verification, Synopsys® VC Formal, Cadence® Incisive® Enterprise Verifier, and JasperGold®; and formal equivalence checkers such as Synopsys® HECTOR, and other logical equivalence checkers (LECs) and sequential logical equivalence checkers (SLECs)).

Formal verification can improve controllability as compared to simulation-based verification. Low controllability occurs when the number of simulation test signals or vectors required to thoroughly simulate a hardware design becomes unmanageable. For example, a 32-bit comparator requires $2^{64}$ test vectors. This may take millions of years to verify exhaustively by simulation-based verification. By performing formal verification, the 32-bit comparator can be verified in less than a minute.

While formal verification can be an effective method for exhaustively verifying properties of a hardware design, this is only true if the properties that are to be verified are presented in such a manner that a formal verification tool can solve the mathematical problem presented thereby. Specifically, during formal verification of a hardware design the hardware design is represented as a mathematical model, the properties to be proved are also represented mathematically, and mathematical reasoning is used to determine if the properties are true for the hardware design based on the mathematical model. In other words, in formal verification the verification is presented as a mathematical problem to be solved. Some mathematical problems will be solvable within a reasonable amount of time by a formal verification tool whereas others will not. When a formal verification tool is able to solve the mathematical problem presented by the hardware design and the properties to be verified then the formal verification is said to converge. When, however, a formal verification tool is unable to solve the mathematical problem presented by the hardware design and the properties to be verified, then the formal verification does not converge, and no results are output, and the verification is inconclusive.

A formal verification method known to the Applicant for verifying the stall independence of a hardware design for a multi-stage component comprises describing the valid states for the component to be in at each stage, then verifying (i) that the data moves from one valid state to another correctly when the relevant stage is enabled; and (ii) the relevant data is unchanged when that stage is not enabled. It can then be proved that the data propagates through the design stage by stage from the beginning. However, this formal verification method requires a detailed understanding of the multi-stage component and has proven too complex to implement, particularly for complex multi-stage components. It is noted that a statement herein that something is known to the Applicant is not an admission that it is well known to a person of skill in the art.

The embodiments described below are provided by way of example only and are not limiting of implementations which solve any or all of the disadvantages of known methods and systems for verifying the stall independence of a hardware design for a multi-stage component.

SUMMARY

This summary is provided to introduce a selection of concepts that are further described below in the detailed description. This summary is not intended to identify key features or essential features of the claimed subject matter, nor is it intended to be used to limit the scope of the claimed subject matter.

Described herein are methods and systems for verifying the stall independence of a hardware design for a multi-stage component configured to receive input data and generate output data by processing the input data at each of plurality of successive stages wherein each stage is independently enabled by a set of one or more enable signals. The method comprises: for each stage of the plurality of stages from the second stage to the last stage: (a) verifying that the relevant portion of the output data of an instantiation of the hardware design is the same if the instantiation is in the same state when that stage is enabled in a cycle by any set of inputs and any subsequent stages are enabled in subsequent cycles by a first minimal sequence of inputs; and (b) verifying that the relevant portion of the output data of an instantiation of the hardware design is the same if the instantiation is in the same state (i) when that stage is enabled in a cycle and any subsequent stages are enabled in subsequent cycles by a second minimal sequence of inputs and (ii) when that stage is stalled, then that stage is enabled in a next cycle, and the subsequent stages are enabled in subsequent cycles by the second minimal sequence of inputs. A minimal sequence of inputs for the subsequent stages is a sequence of inputs which progress a same input through each of the subsequent stages. In some cases the first and/or second minimal sequence of inputs comprises a sequence of inputs in which the subsequent stages are enabled in successive cycles.

A first aspect provides a method of verifying a hardware design for a multi-stage component configured to receive input data and generate output data by processing the input data at each of a plurality of successive stages, each stage capable of being enabled or stalled each cycle, the method comprising at one or more processors: for each stage of the plurality of stages from the second stage to the last stage: verifying a first property, the first property being that a relevant portion of the output data of an instantiation of the hardware design is the same if the instantiation is in the same state when that stage is enabled in a cycle by any set of inputs and any subsequent stages are enabled in subsequent cycles by a first minimal sequence of inputs; verifying a second property, the second property being that the relevant portion of the output data of an instantiation of the hardware design is the same if the instantiation is in the same state (i) when that stage is enabled in a cycle and any subsequent stages are enabled in subsequent cycles by a second minimal sequence of inputs and (ii) when that stage is stalled, then that stage is enabled in a next cycle, and the subsequent stages are enabled in subsequent cycles by the second minimal sequence of inputs.

The second property may be verified for a stage under a constraint that when the stage is stalled in a cycle that a stage preceding that stage is also stalled.

The relevant portion of the output data may be all of the output data.

The relevant portion of the output data may be based on the input to the multi-stage component and/or an operating mode of the multi-stage component.

The method may further comprise verifying that the hardware design is independent of initial state by verifying that the output data of an instantiation of the hardware design is the same for the same input data when the stages are enabled by a minimal sequence of inputs regardless of an initial state of the hardware design.

The first property may be verified for a stage for each possible valid state of the multi-stage component.

The first property may be verified for a stage for each possible set of inputs to the multi-stage component in which the stage is enabled.

The first property may be verified for a stage for only one minimal sequence of inputs.

The second property may be verified for a stage for each possible valid state of the multi-stage component.

The second property may be verified for a stage for each possible set of inputs in which the stage is stalled.

The second property may be verified for a stage for only one minimal sequence of inputs.

A minimal sequence of inputs for the subsequent stages is a sequence of inputs which progress a same input through each of the subsequent stages.

The first and/or second minimal sequence of inputs may comprise a sequence of inputs in which the subsequent stages are enabled in successive cycles.

The method may further comprise outputting one or more signals indicating whether the verifications were successful.

The method may further comprise, in response to determining that at least one of the verifications was not successful, modifying the hardware design.

The method may further comprise re-verifying the modified hardware design.

The first property may be formally verified using a formal verification tool.

Formal verifying the first property may comprise formally verifying one or more assertions under one or more constraints.

The second property may be formally verified using a formal verification tool.

Formal verifying the second property may comprise formally verifying one or more assertions under one or more constraints.

The method may further comprise, in response to determining that the verifications were successful, manufacturing, using an integrated circuit manufacturing system, an integrated circuit embodying the multi-stage component according to the hardware design.

Manufacturing, using an integrated circuit manufacturing system, an integrated circuit embodying the multi-stage component according to the hardware design may comprise: processing, using a layout processing system, the hardware design so as to generate a circuit layout description of an integrated circuit embodying the multi-stage component; and manufacturing, using an integrated circuit generation system, an integrated circuit embodying the multi-stage component according to the circuit layout description.

When processed in an integrated circuit manufacturing system, the hardware design for the multi-stage component may configure the integrated circuit manufacturing system to manufacture an integrated circuit embodying the multi-stage component.

A second aspect provides a system for verifying that a hardware design for a multi-stage component is stall independent, the system comprising: memory comprising: the hardware design for the multi-stage component, the component configured to receive input data and generate output data by processing the input data at each of a plurality of successive stage, each stage capable of being enabled or stalled each cycle; and one or more verification tools; and one or more processors configured to, for each stage of the plurality of stages from the second stage to the last stage: verify a first property using one or more of the verification tools, the first property being that a relevant portion of the output data of an instantiation of the hardware design is the same if the instantiation is in the same state when that stage is enabled in a cycle by any set of inputs and any subsequent stages are enabled in subsequent cycles by a first minimal sequence of inputs; and verify a second property, using one or more of the verification tools, the second property being that the relevant portion of the output data of an instantiation of the hardware design is the same if the instantiation is in the same state (i) when that stage is enabled in a cycle and any subsequent stages are enabled in subsequent cycles by a second minimal set of inputs and (ii) when that stage is stalled, then that stage is enabled in a next cycle and the subsequent stages are enabled in subsequent cycles by the second minimal sequence of inputs.

A third aspect provides a computer-implemented method of verifying a hardware design for a multi-stage component configured to receive input data and generate output data by processing the input data at each of a plurality of successive stages, each stage capable of being enabled or stalled each cycle, each stage having none, one, or more than one subsequent stage, the method comprising, at one or more processors: for each stage of the plurality of stages from the second stage to the last stage: verifying a first property, the first property being that a relevant portion of the output data of an instantiation of the hardware design is the same if the instantiation is in the same state when that stage is enabled in a cycle by any set of inputs and the subsequent stages are enabled in subsequent cycles by a first minimal sequence of inputs; and verifying a second property, the second property being that the relevant portion of the output data of an instantiation of the hardware design is the same if the instantiation is in the same state (i) when that stage is enabled in a cycle and the subsequent stages are enabled in subsequent cycles by a second minimal sequence of inputs and (ii) when that stage is stalled, then that stage is enabled in the next cycle, and the subsequent stages are enabled in subsequent cycles by the second minimal sequence of inputs (306); wherein a minimal sequence of inputs for the subsequent stages is a sequence of inputs which progress a same input through each of the subsequent stages; wherein the relevant portion of the output data is the portion of the output data that is expected to be the same when the same input data is processed.

A fourth aspect provides a system for verifying that a hardware design for a multi-stage component is stall independent, the system comprising: memory comprising: the hardware design for the multi-stage component, the component configured to receive input data and generate output data by processing the input data at each of a plurality of successive stages, each stage capable of being enabled or stalled each cycle, each stage having none, one, or more than one subsequent stage, and one or more verification tools; and one or more processors configured to, for each stage of the plurality of stages from the second stage to the last stage: verify a first property using one or more of the verification tools, the first property being that a relevant portion of the output data of an instantiation of the hardware design is the same if the instantiation is in the same state when that stage is enabled in a cycle by any set of inputs and the subsequent stages are enabled in subsequent cycles by a first minimal sequence of inputs, and verify a second property using one or more of the verification tools, the second property being that the relevant portion of the output data of an instantiation of the hardware design is the same if the instantiation is in the same state (i) when that stage is enabled in a cycle and the subsequent stages are enabled in subsequent cycles by a second minimal sequence of inputs and (ii) when that stage is stalled, then that stage is enabled in the next cycle and the subsequent stages are enabled in subsequent cycles by the second minimal sequence of inputs; wherein a minimal sequence of inputs for the subsequent stages is a sequence of inputs which progress a same input through each of the subsequent stages; wherein the relevant portion of the output data is the portion of the output data that is expected to be the same when the same input data is processed.

A hardware design for a multi-stage component, when processed in an integrated circuit manufacturing system, may configure the system to manufacture an integrated circuit embodying the multi-stage component. There may be provided a non-transitory computer readable storage medium having stored thereon a hardware design for a multi-stage component that, when processed in an integrated circuit manufacturing system, causes the integrated circuit manufacturing system to manufacture an integrated circuit embodying the component.

There may be provided an integrated circuit manufacturing system comprising: a non-transitory computer readable storage medium having stored thereon a hardware design for a multi-stage component; a layout processing system configured to process the hardware design so as to generate a circuit layout description of an integrated circuit embodying the component; and an integrated circuit generation system configured to manufacture an integrated circuit embodying the multi-stage component according to the circuit layout description.

There may be provided computer program code for performing a method as described herein. There may be provided non-transitory computer readable storage medium having stored thereon computer readable instructions that, when executed at a computer system, cause the computer system to perform the methods as described herein.

The above features may be combined as appropriate, as would be apparent to a skilled person, and may be combined with any of the aspects of the examples described herein.

BRIEF DESCRIPTION OF THE DRAWINGS

Examples will now be described in detail with reference to the accompanying drawings in which.

Figure 1:
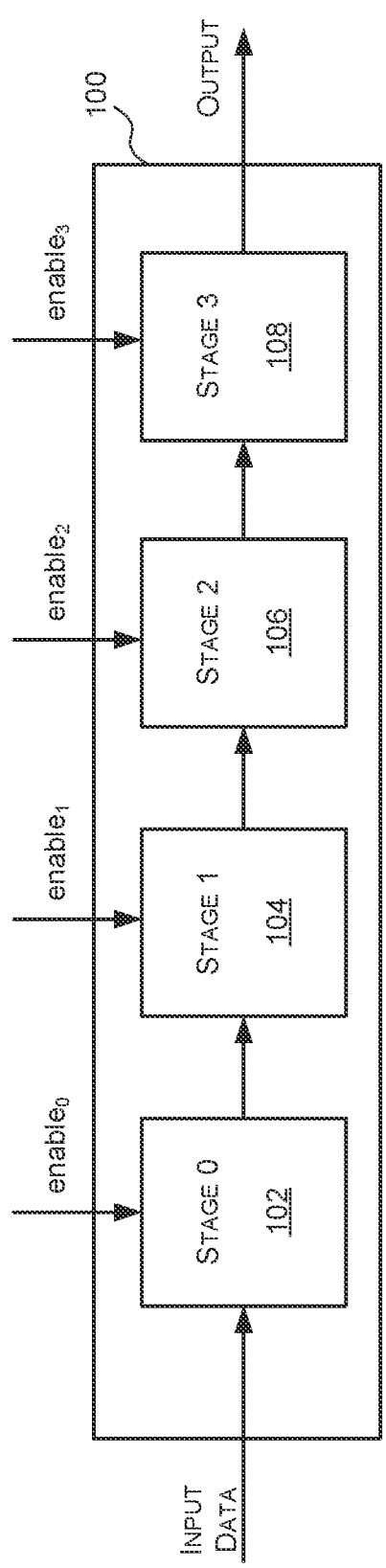
FIG. 1 is a block diagram of an example multi-stage component and the flow of data through the component when there are no stalls.
Figure 1:
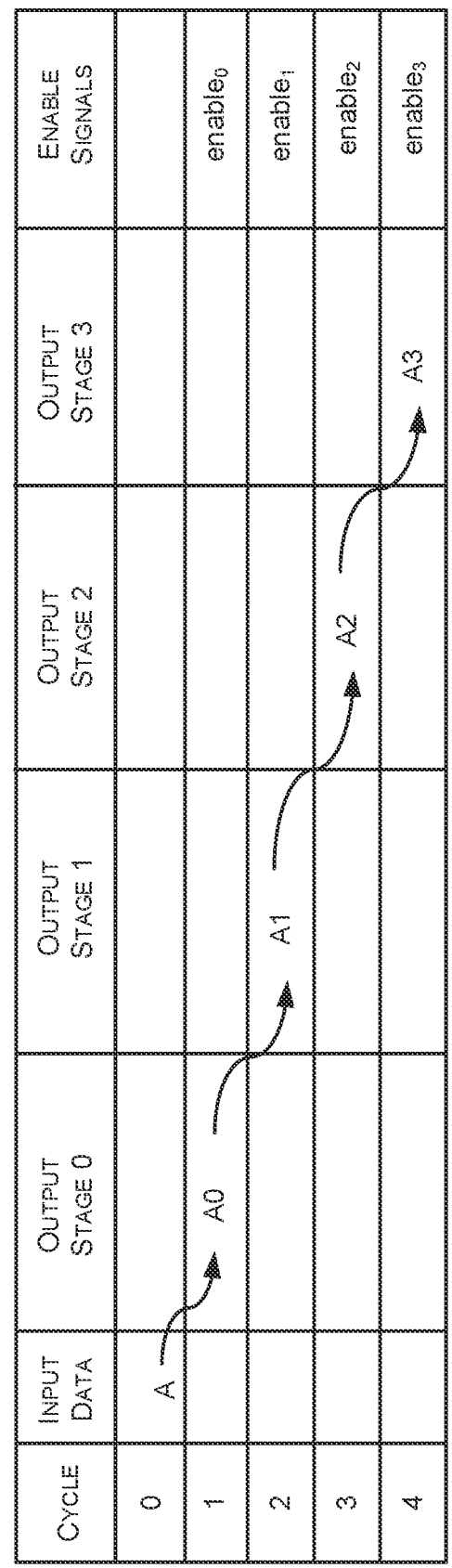

The accompanying drawings illustrate various examples. The skilled person will appreciate that the illustrated element boundaries (e.g., boxes, groups of boxes, or other shapes) in the drawings represent one example of the boundaries. It may be that in some examples, one element may be designed as multiple elements or that multiple elements may be designed as one element. Common reference numerals are used throughout the figures, where appropriate, to indicate similar features.

DETAILED DESCRIPTION

The following description is presented by way of example to enable a person skilled in the art to make and use the invention. The present invention is not limited to the embodiments described herein and various modifications to the disclosed embodiments will be apparent to those skilled in the art. Embodiments are described by way of example only.

While formal verification can provide advantages over simulation-based verification, the formal verification method known to the Applicant to formally verify the stall independence of a hardware design for a multi-stage component by working through the design stage by stage to verify that the data moves from one valid state to another has been difficult, and sometimes impossible, to implement. This is because such a method requires an in-depth knowledge or understanding of the operation of the multi-stage component which is not always attainable or easily attainable; and is so complex to implement that it is infeasible to implement for many multi-stage components, particularly complex multi-stage components.

Accordingly, described herein are methods and systems for verifying the stall independence of a hardware design for a multi-stage component that works backwards from the final stage of the multi-stage component. Specifically, in the methods and systems described herein the stall independence of the last stage is verified, then the stall independence of the second to last stage is verified and so on up to the second stage. The stall independence for a particular stage is verified by: (a) verifying that the relevant portion of the output data of an instantiation of the hardware design is the same if the instantiation is in the same state when that stage is enabled in a cycle by any set of inputs and any subsequent stages are enabled in subsequent cycles by a first minimal sequence of inputs; and (b) verifying that the relevant portion of the output data of an instantiation of the hardware design is the same if the instantiation is in the same state (i) when that stage is enabled in a cycle and any subsequent stages are enabled in subsequent cycles by a second minimal sequence of inputs and (ii) when that stage is stalled and the data is not overwritten, then that stage is enabled in the next cycle, and the subsequent stages are enabled in subsequent cycles by the second minimal sequence of inputs.

The term "relevant portion of the output data" is used herein to mean the portion of the output data that is always expected to be the same when the same input data is processed by the multi-stage component. In some cases, the relevant portion of the output data will be all of the output data. However, as described in more detail below, in other cases, a multi-stage component may have multiple operating modes where in at least one of the operating modes not all of the outputs are needed. When a multi-stage component is operating in such a mode it may allow the component to output anything (e.g. junk) in the non-relevant portions. Accordingly, when a multi-stage component is operating in such a mode the output data generated when a set of input data is processed by the multi-stage component may be different for stalling of different stages. For these multi-stage components the relevant portion of the output data may be identified by an element of the output data and/or an element of the input data.

A mathematical proof that establishes that verifying (a) and (b) for each stage verifies the stall independence of the hardware design for a multi-stage component—i.e. verifies that for the same input data the component will produce the same relevant output data regardless of the number of stalls and the location of the stalls that occur during processing of that input data—is provided below.

The methods and systems described herein allow the stall independence of a hardware design for a multi-stage component to be verified in an efficient manner. Firstly, as the stall independence is verified based on the output of an instantiation of the hardware design the verification can be performed without an understanding of the internal workings of the component. This makes the methods and systems described herein much easier to implement than the method known to the Applicant for verifying the stall independence of a hardware design for a multi-stage component. It also makes the method and implementation thereof more robust to changes in the hardware design. Secondly, some formal verification tools, such as, but not limited to, Synopsys®' Hector, which may be referred to herein as arithmetic formal verification tools, are proficient at verifying properties related to data transformations (such as arithmetic operations) but can typically only be used to prove a property over a finite period of time. Other verification tools, such as, but not limited to, Cadence®'s Incisive® Enterprise Verifier (IEV) or JasperGold®, which may be referred to herein as infinite time formal verification tools, are proficient at verifying a property over an infinite time period but are poor at verifying properties related to data transformations (such as arithmetic operations). Since the methods described herein only consider one cycle of stalling at a time, arithmetic formal verification tools may be used which increases the likelihood that the verifications converge, particularly for components that are configured to process the input data thereto via one or more data transformations (e.g. arithmetic operations).

Figure 3:
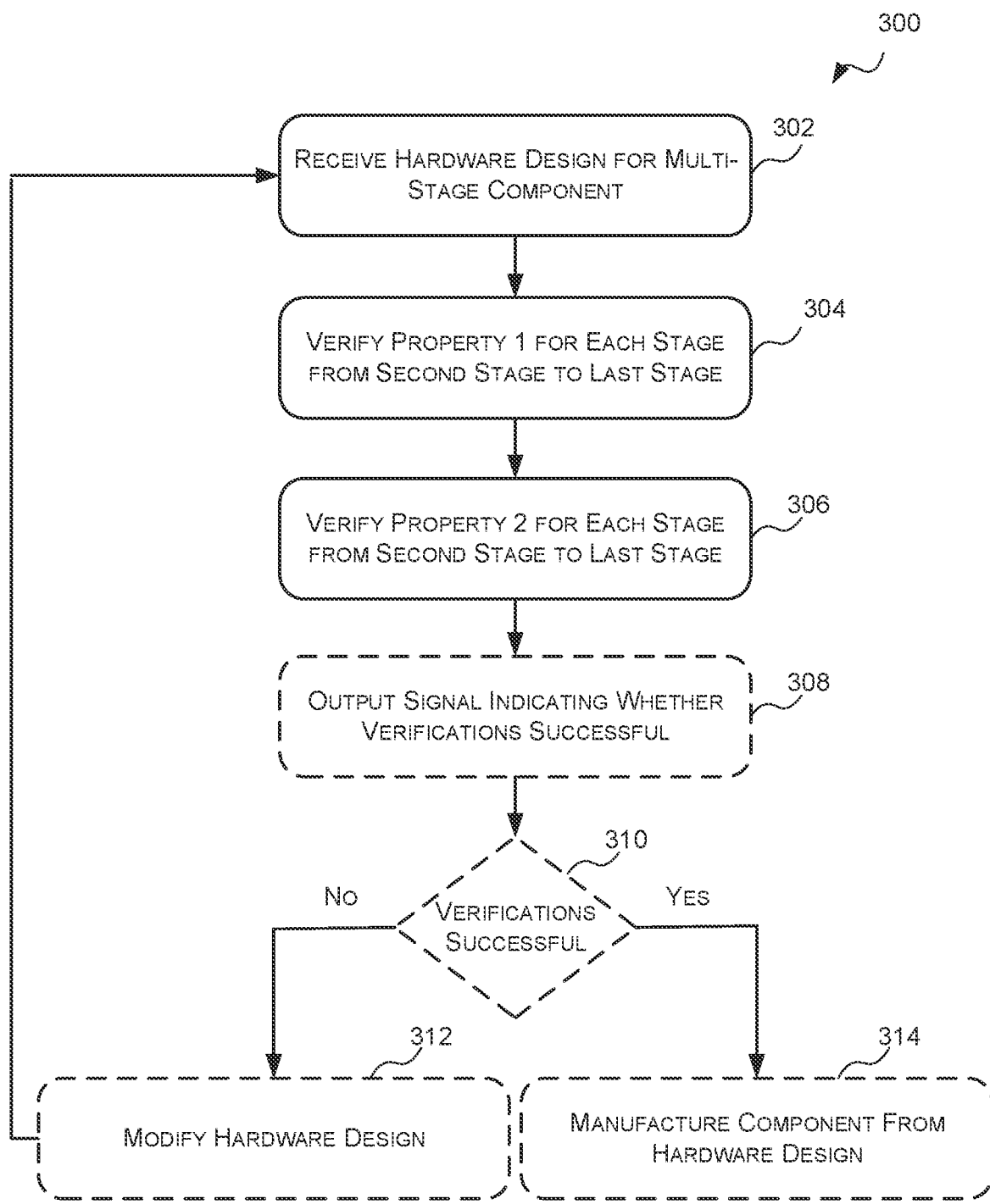
FIG. 3 is a flow diagram of an example method for verifying the stall independence of a hardware design for a multi-stage component.

Reference is now made to FIG. 3 which illustrates an example method 300 of verifying the stall independence of a hardware design for a multi-stage component. As described above, a hardware design for a multi-stage component is stall independent if an instantiation of the hardware design will generate the same output data in response to the same input data regardless of the number or location of stalls that occur during processing of the input data. The method 300 may be implemented by a computing-based device such as, but not limited to, the computing-based device 1100 described below with respect to FIG. 11. For example, there may be a computer readable storage medium having stored thereon computer readable instructions that, when executed at a computing-based device, cause the computing-based device to perform the method 300 of FIG. 3.

The method 300 begins at block 302 where a hardware design for a multi-stage component is received.

A "hardware design" is a description of the structure and/or function of an integrated circuit which, when processed at an integrated circuit manufacturing system, causes the integrated circuit manufacturing system to generate an integrated circuit described by the hardware design. For example, as described in more detail below with respect to FIG. 13, when a hardware design is processed at an integrated circuit manufacturing system the integrated circuit manufacturing system may generate the integrated circuit described by the design by synthesizing the hardware design into silicon, or, by loading configuration data into a field-programmable gate array (FPGA).

A hardware design may be implemented in a high-level hardware description language (HDL), such as, but not limited to, a register transfer level (RTL) language. Examples of register transfer level languages include, but are not limited to, VHDL (VHSIC Hardware Description Language) and Verilog®. It will be evident to a person of skill in the art that other high-level hardware description languages may be used such as proprietary high-level hardware description languages.

An "instantiation of a hardware design" is a representation of the hardware and/or functionality of the hardware defined by the hardware design. An instantiation of a hardware design includes, but is not limited to, an emulation model of the integrated circuit hardware design that simulates the behaviour of the hardware defined by the hardware design, a synthesized version (e.g. netlist) of the hardware design, a hardware implementation (e.g. integrated circuit or a field-programmable gate array (FPGA)) of the hardware design, and a mathematical model of the hardware design generated by a formal verification tool. An instantiation of the hardware design embodies the hardware design in a form which can be tested to verify the hardware design.

A hardware design for a multi-stage component is thus a description of the structure and/or function of an integrated circuit that implements a multi-stage component which, when processed at an integrated circuit manufacturing system causes the integrated circuit manufacturing system to generate an integrated circuit that embodies the multi-stage component. As described above, a multi-stage component is a component that receives input data and generates output data corresponding to the input data by processing the input data at a plurality of successive stages. Each stage may be implemented by a different set of hardware logic, or two or more stages may be implemented by the same hardware logic. The term multi-stage component is intended to encompass any component or set of components that together form a component wherein input data is processed in multiple stages. Accordingly, a multi-stage component includes a set of components wherein one or more of the multiple stages are implemented by separate components wherein downstream components process the data generated by upstream components.

Figure 2:
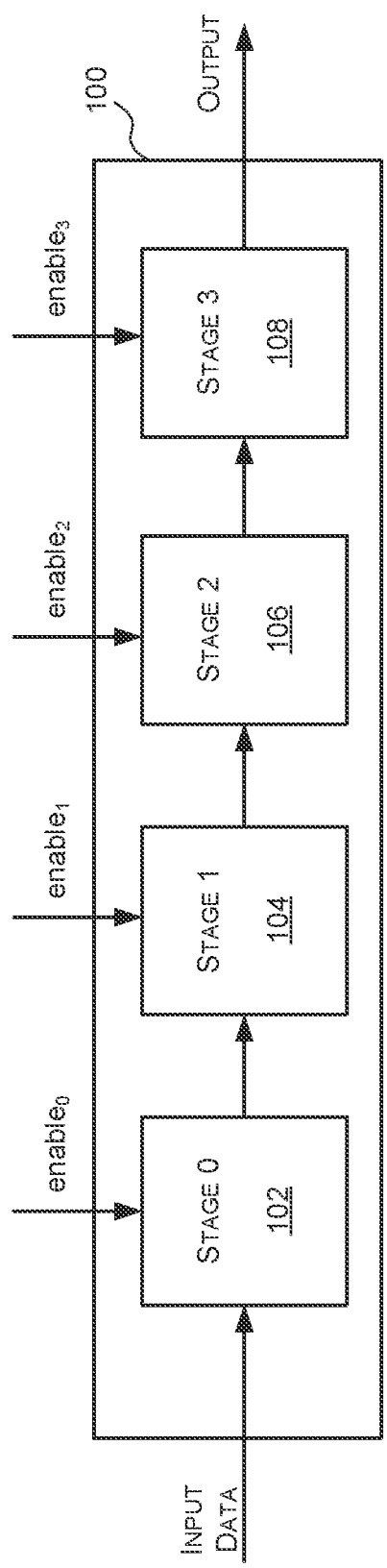
FIG. 2 is a block diagram of the multi-stage component of FIG. 1 and the flow of data through the component when there are stalls.
Figure 2:
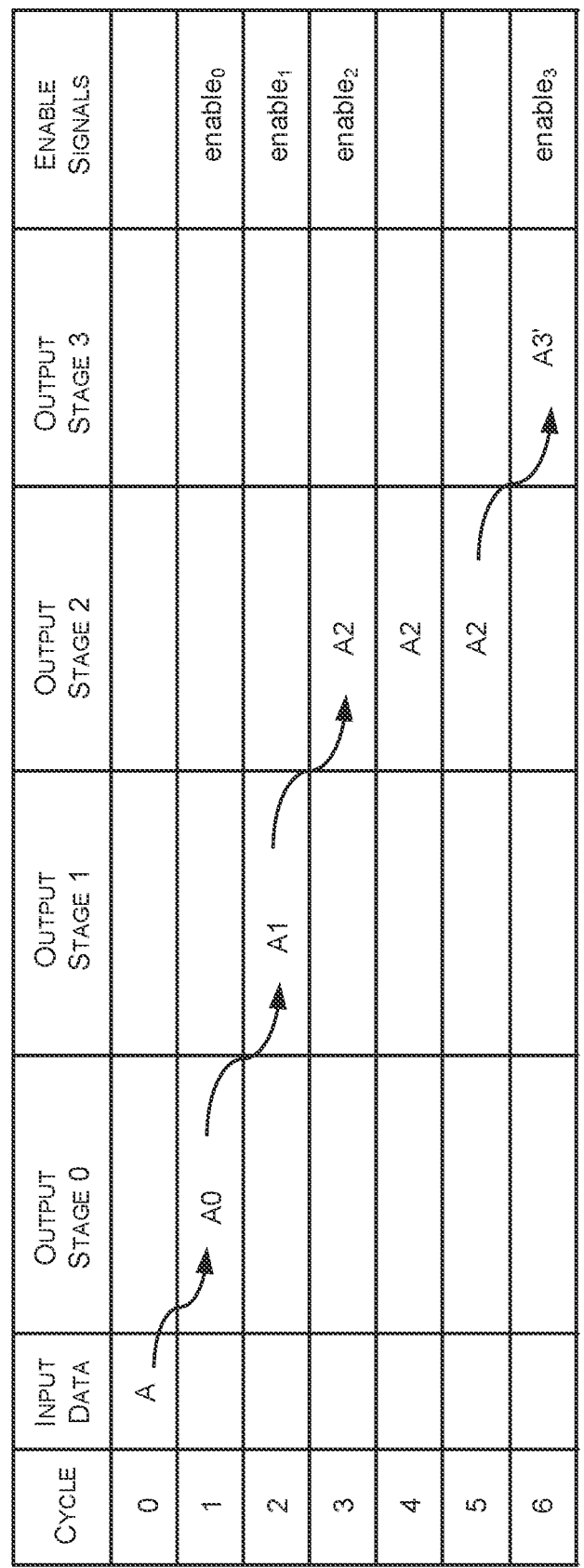

The methods and systems described herein are designed for multi-stage components that are stage-enabled. A multi-stage component is stage enabled if each stage is separately enabled by a set of one or more enable signals and a stage only processes the output data of the previous stage if it is enabled. The set of one or more enable signals may comprise a single enable signal or it may comprise a concatenation or combination of a plurality of signals. Accordingly, when a multi-stage component is stage enabled, if a stage is not enabled the output data for that stage remains the same. An example multi-stage component 100 that is stage-enabled was described above with respect to FIGS. 1 and 2.

Once the hardware design for the multi-stage component has been received the method 300 proceeds to block 304.

At block 304, it is formally verified, for each stage of the multi-stage component from the second stage to the last stage, that the relevant portion of the output data of an instantiation of the hardware design is the same if the instantiation is in the same state when that stage is enabled in a cycle by any set of inputs and any subsequent stages are enabled in subsequent cycles via a minimal sequence of inputs. As described in more detail below, a minimal sequence of inputs for a set of stages is a sequence of inputs which progress the data from the first stage in the set to the last stage in the set. A sequence of inputs which may not progress the data through each stage in the set (e.g. because for example, due to a stall, it may be overwritten before it is processed at a stage) is not a minimal sequence of inputs. A minimal sequence of inputs may or may not have a stall at one or more of the stages in the set. The simplest minimal sequence of inputs for a set of stages is a sequence of inputs which enables the stages in the set in successive cycles. For example, a minimal sequence of inputs for two stages numbered 1 and 2 may include a sequence of inputs wherein stage 1 is enabled in a first cycle and stage 2 is enabled in the second cycle. Another minimal sequence of inputs for the two stages may be a sequence of inputs wherein stage 1 is enabled in a first cycle, stages 1 and 2 are stalled in a second cycle, and stage 2 is enabled in the third cycle.

This is referred to herein as verifying 'Property 1'. In other words, verifying 'Property 1' for a particular stage verifies that when data is waiting in a particular stage to be processed by the next stage the relevant portion of the output data resulting from processing that data at each subsequent stage will be the same regardless of the other inputs (e.g. the input data) to the component when the next stage is enabled—i.e. that the other inputs to the component do not affect the progression of data from the particular stage to the output.

For example, verifying Property 1 for the last stage of a multi-stage component comprises verifying that if an instantiation of the hardware design is in the same state when the last stage is enabled that the output of the instantiation caused by enabling the last stage of the instantiation will be the same. For example, let there be a multi-stage component wherein the last stage of the component takes a register value, x, and in the last cycle outputs 3*x. In this case, if the state of the instantiation is defined by the registers, it is verified that if the register is set to 6 when the last stage is enabled then the output will be 18 regardless of which of the other stages are enabled in the same cycle as the last stage and regardless of the data input to the component in that cycle. It is noted that there are no stages subsequent the last stage so there are no other stages to enable in subsequent cycles.

In another example, verifying Property 1 for the second to last stage of a multi-stage component comprises verifying that if an instantiation of the hardware design is in the same state when in a first cycle the second to last stage is enabled and then in a second cycle the last stage is enabled that the output of the instantiation resulting from enabling the last stage will be the same. For example, let the penultimate stage of the multi-stage component described in the previous paragraph take a second register value, y, and set the first register value, x, to 2+y. As described above, the last stage then takes the first register value, x, and outputs 3*x. In this case, if the state of the instantiation is defined by the registers, it is verified that if the second register is set to 4 when the second to last stage is enabled in a first cycle and then in a second cycle the last stage is enabled, that the output will be 18 regardless of which of the other stages are enabled in the same cycle as that second to last stage and regardless of the data input to the component in that cycle. It is noted that in this case it is not verified that the penultimate stage sets the first register, x, to 6, it is only verified that the final output is the same (i.e. is 18) when the second register is set to 4.

As described above, formal verification is a systematic process that uses mathematical reasoning to verify a property of a hardware design. In contrast, simulation-based verification is a process in which a hardware design is tested by applying stimuli to the hardware design and monitoring the output of the hardware design in response to the stimuli.

Formally verifying Property 1 for a particular stage may comprise formally verifying one or more formal assertions are true, or hold, for the hardware design under one or more constraints, which, if verified to be true, establish the property. An assertion may also be referred to as a "lemma" in some programming languages and tools, such as Synopsys' HECTOR.

As is known to those of skill in the art, a formal assertion is a statement or expression that indicates that a formal property must be true for an instantiation of the hardware design to be behaving as expected. An example format for a formal assertion is assert property [FORMAL PROPERTY STATEMENT] which indicates that the FORMAL PROPERTY STATEMENT must be true. A formal property statement is a statement or expression that captures design behaviour. For example, a formal property statement for the property that signal a of the hardware design is equal to signal b of the hardware design may be a=b. Within HDL designs, a formal property statement is an executable statement that checks for specific behaviour within the HDL design. Formal property statements are used to capture required or desired temporal behaviour of an instantiation of the hardware design in a formal and unambiguous way.

Formal assertions are typically written in an assertion language. An assertion language, which also may be referred to as a property language, captures the design behaviour over multiple design cycles in a concise, unambiguous manner. While traditional hardware description languages (HDL), such as VHDL or Verilog RTL, have the ability to capture individual cycle behaviour, they are too detailed to describe properties at a higher level. In particular, assertion languages provide means to express temporal relationships and complex design behaviours in a concise manner. Assertion languages include, but are not limited to, SystemVerilog Assertions (SVA), Property Specification Language (PSL), Incisive® Assertion Library (IAL), Synopsys® OpenVera™ Assertions (OVA), Symbolic Trajectory Evaluation (STE), Hardware Property Language (HPL), 0-In®, and Open Verification Library (OVL).

As is known to those of skill in the art, a constraint in formal verification constrains the state space under which formal verification is performed. In some cases, a constraint may be implemented by a formal assume statement, which may also be referred to as an assumption or an assumption statement. An example format for a formal assume statement is assume property [FORMAL PROPERTY STATEMENT] which causes a formal verification tool to formally verify an assertion only for states or sequences of states of an instantiation of the hardware design where FORMAL PROPERTY STATEMENT is true. For example, the example assume statement assume property a>b will cause a formal verification tool to only verify an assertion for states or sequences of states of an instantiation of the hardware design when a is greater than b.

Once the formal assertions and constraints have been established, a formal verification tool is used to formally verify that the one or more formal assertions are true, or hold, for the hardware design under the constraints. A formal verification tool is a software tool that is capable of performing formal verification of a hardware design. Formal verification tools include, but are not limited to, formal model checkers (which also may be referred to as formal property checkers) which are configured to formally verify a property of an integrated circuit hardware design; and formal equivalence checkers which are configured to formally verify the equivalence of two designs (e.g. two integrated circuit hardware designs, or an integrated circuit hardware design and a netlist etc.). Examples of formal model checkers include, but are not limited to, OneSpin 360® DV, Mentor Graphics Questa® Formal Verification, Synopsys® VC Formal, Cadence® Incisive® Enterprise Verifier, and JasperGold®. Examples of formal equivalence checkers include, but are not limited to Synopsys® HECTOR, JasperGold® Sequential Equivalence Checking (SEC) App, and other logical equivalence checkers (LECs) and sequential logical equivalence checkers (SLECs).

In formal verification the hardware design (e.g. the hardware design for a multi-stage component) is transformed into a mathematical model (e.g. a state-transition system, or a flow graph) to thereby provide an instantiation of the hardware design which can be tested to verify the hardware design, and the formal properties to be verified (e.g. the asserted properties) are expressed using mathematical logic using a precise syntax or a language with a precise mathematical syntax and semantics.

A formal verification tool verifies an assertion by searching the entire reachable state space of the instantiation of the hardware design (e.g. state-transition system, or flow graph) without explicitly traversing all the states to determine if there is a valid state of the instantiation of the hardware design (as defined by the formal constraints) in which the asserted property is not true. The search is done by, for example, encoding the states using efficient Boolean encodings using Binary decision diagrams (BDDS), or using advanced SAT (satisfiability-based bounded model checking) based techniques. In some cases, tools can be used to implement techniques, such as, but not limited to, abstraction, symmetry, symbolic indexing, and invariants to improve performance and achieve scalability. Since formal verification of an assertion algorithmically and exhaustively explores all valid input values over time, verifying a property in this manner allows a property to be exhaustively proved or disproved for all valid states.

An example set of SVA assertions and constraints for verifying Property 1 for the last stage of a multi-stage component is shown below using two copies of the same hardware design. In this example impl1 is an instantiation of the first copy of a hardware design for a multi-stage component with n stages where the stages are numbered from 0 to n−1; impl2 is the instantiation of the second copy of the hardware design; impli . . . (c) refers to the $c^{th}$ cycle of the instantiation of the $i^{th}$ copy of the hardware design; impli.state . . . is the state of the instantiation of the $i^{th}$ copy of the hardware design; impli.enable$_k$ . . . is the enable signal for the $k^{th}$ stage of the instantiation of the $i^{th}$ copy of the hardware design; and impli.output . . . is the output of the instantiation of the $i^{th}$ copy of the hardware design.

assume property impl1.state(1)=impl2.state(1);
    assume property impl1.enable$_{n-1}$(1)=1;
    assume property impl2.enable$_{n-1}$(1)=1;
    assert property impl1.output(2)=impl2.output(2);

It will be evident to a person of skill in the art that: (i) the first assume statement states that in the first cycle (cycle 1) the instantiations are in the same state (i.e. the instantiations start in the same state); (ii) the second assume statement states that in the first cycle (cycle 1) the last stage of the instantiation of the first copy of the hardware design is enabled; (iii) the third assume statement states that in the first cycle (cycle 1) the last stage of the instantiation of the second copy of the hardware design is enabled; and (iv) the assertion states that in the second cycle the outputs of the two instantiations are the same.

The assume statements cause: the instantiations of the two copies of the hardware design to start in the same state; the last stage of the instantiation of the first copy of the hardware design to be enabled in the first cycle so that an output corresponding to that initial starting state will be generated in the second cycle; and the last stage of the instantiation of the second copy of the hardware design to be enabled in the first cycle so that an output corresponding to that initial starting state will be generated in the second cycle. The assertion then compares the outputs of the instantiations of the first and second copies of the hardware design in the second cycle to ensure they match. The formal verification tool can be configured to verify the assertion for all possible starting states, and all possible inputs that cause the last stage to be enabled. It will be evident to a person of skill in the art that this is an example only and that other assertions and assumption statements may be used to verify Property 1 for the last stage.

Note that in this example no restrictions or constraints are applied to any inputs apart from the enable signal(s). In other examples, additional assumptions may be used to ensure that the inputs do not force the component to stop processing inputs. For example, in some cases there may be an additional assumption that states that a reset is not initiated.

An example set of SVA assertions and constraints for verifying Property 1 for the second to last stage of a multi-stage component is shown below using two copies of the same design:

assume property impl1.state(1)=impl2.state(1);
    assume property impl1.enable$_{n-2}$(1)=1;
    assume property impl2.enable$_{n-2}$(1)=1;
    assume property impl1.enable$_{n-1}$(2)=1;
    assume property impl2.enable$_{n-1}$(2)=1;
    assert property impl1.output(3)=impl2.output(3);

It will be evident to a person of skill in the art that: (i) the first assume statement states that in the first cycle (cycle 1) the instantiations are in the same state (i.e. the instantiations start in the same state); (ii) the second assume statement states that in the first cycle (cycle 1) the second last stage of the instantiation of the first copy of the hardware design is enabled; (iii) the third assume statement states that in the first cycle (cycle 1) the second to last stage of the instantiation of the second copy of the hardware design is enabled; (iv) the fourth assume statement states that in the second cycle (cycle 2) the last stage of the instantiation of the first copy of the hardware design is enabled; (v) the fifth assume statement states that in the second cycle (cycle 2) the last stage of the instantiation of the second copy of the hardware design is enabled; and (vi) the assertion states that in the third cycle (cycle 3) the outputs of the two instantiations are the same.

The assume statements cause: the instantiations of the two copies of the hardware design to start in the same state; the second last stage of the instantiation of the first copy of the hardware design to be enabled in a first cycle, and the last stage of the instantiation of the first copy of the hardware design to be enabled in the second cycle so that an output corresponding to that initial starting state will be generated in the third cycle; and the second last stage of the instantiation of the second copy of the hardware design to be enabled in a first cycle, and the last stage of the instantiation of the second copy of the hardware design to be enabled in the second cycle so that an output corresponding to that initial starting state will be generated in the third cycle. The assertion then compares the outputs of the instantiations of the first and second copies of the hardware design in the third cycle to ensure they match. The formal verification tool can be configured to verify that the assertion is true for all possible starting states, and all possible inputs that cause the second to last stage to be enabled. As described in more detail below in the mathematical proof section, the assertion may only need to be verified for one set of inputs that enable the last stage. It will be evident to a person of skill in the art that this is an example only and that other assertions and assumption statements may be used to verify Property 1 for the second to last stage.

Since these assertions relate the output of multiple copies of the same design and formal equivalence checkers are optimized to compare two designs, it may be beneficial to verify these example assertions using a formal equivalence checker. However, while using a formal equivalence checker in these cases may provide certain advantages (e.g. in terms of efficiency), a person of skill in the art would understand that this does not, however, preclude the use of a formal model checker to verify such assertions.

A similar set of constraints and assertions may be generated for each of the other relevant stages.

The verification of Property 1 for the stages of the multi-stage component may be performed sequentially or in parallel, and in any order. For example, Property 1 may be verified for the stages in order, starting with the last stage (e.g. verify Property 1 for the last stage, verify Property 1 for the second last stage . . . verify Property 1 for the second stage). In other examples, Property 1 may be verified for each of the relevant stages in parallel (e.g. verify Property 1 for second stage, verify Property 1 for the third stage . . . verify Property 1 for the last stage all in parallel).

Once Property 1 has been verified for each relevant stage of the multi-stage component the method 300 proceeds to block 306.

At block 306, it is formally verified, for each stage of the multi-stage component from the second stage to the last stage, that the relevant portion of the output of an instantiation of the hardware design is the same if the instantiation is in the same state (i) when that stage is enabled in a cycle and any subsequent stages are enabled in subsequent cycles via a minimal sequence of inputs; and (ii) when that stage is stalled for a single cycle, then that stage is enabled in a next cycle and the subsequent stages are enabled in subsequent cycles by the minimal sequence of inputs.

As described in more detail below, a minimal sequence of inputs for a set of stages is a sequence of inputs which progresses data from the first stage in the set to the last stage in the set. A sequence of inputs which may not progress the data through each stage in the set (e.g. because for example, due to a stall, it may be overwritten before it is processed at a stage) is not a minimal sequence of inputs. A minimal sequence of inputs may or may not have a stall at one or more of the stages in the set. The simplest minimal sequence of inputs for a set of stages is a sequence of inputs which enables the stages in the set in successive cycles. For example, a minimal sequence of inputs for two stages numbered 1 and 2 may include a sequence of inputs wherein stage 1 is enabled in a first cycle and stage 2 is enabled in a second cycle. Another minimal sequence of inputs for the two stages may be a sequence of inputs wherein stage 1 is enabled in a first cycle, stages 1 and 2 are stalled in a second cycle, and stage 2 is enabled in a third cycle.

This is referred to herein as verifying 'Property 2'. In other words, verifying Property 2 for a stage verifies that a stall at that stage will not affect the output.

In some cases, even if an instantiation of the hardware design is in the same state when (i) (i.e. no stalls) and (ii) (i.e. a single stall of the relevant stage) occur the corresponding outputs may not be expected to be the same. As described above, when a stage is enabled it processes the output of the previous stage to generate output data; and when a stage is not enabled it does not process new data and the output data related thereto remains the same. Therefore if the data in the previous stage changes in the cycle a stage is stalled the corresponding output data will not be the same as if that stage had been enabled in that cycle. This may occur when the previous stage is enabled in the same cycle that the stage is stalled.

For example, if a component is in a particular state in cycle 1 such that the output of stage i is A. If in cycle 1 stage i+1 is enabled, then stage i+1 will process A to generate an output for stage i+1.

If however, in cycle 1 stage i+1 is stalled and stage i is enabled, then in cycle 1 stage i may process the output data of stage i−1 to generate output B. Then if stage i+1 is enabled in cycle 2, stage i+1 will process B to generate an output.

If, however, in cycle 1 stage i+1 is stalled and stage i is also stalled, the output for stage i remains A. Then if stage i+1 is then enabled in cycle 2, stage i+1 will process A to generate an output.

Accordingly, in some cases Property 2 is only verified for cases where when a stage is stalled the output data for the previous stage does not change—i.e. for cases where when the relevant stage is stalled the previous stage is also stalled.

Figure 4:
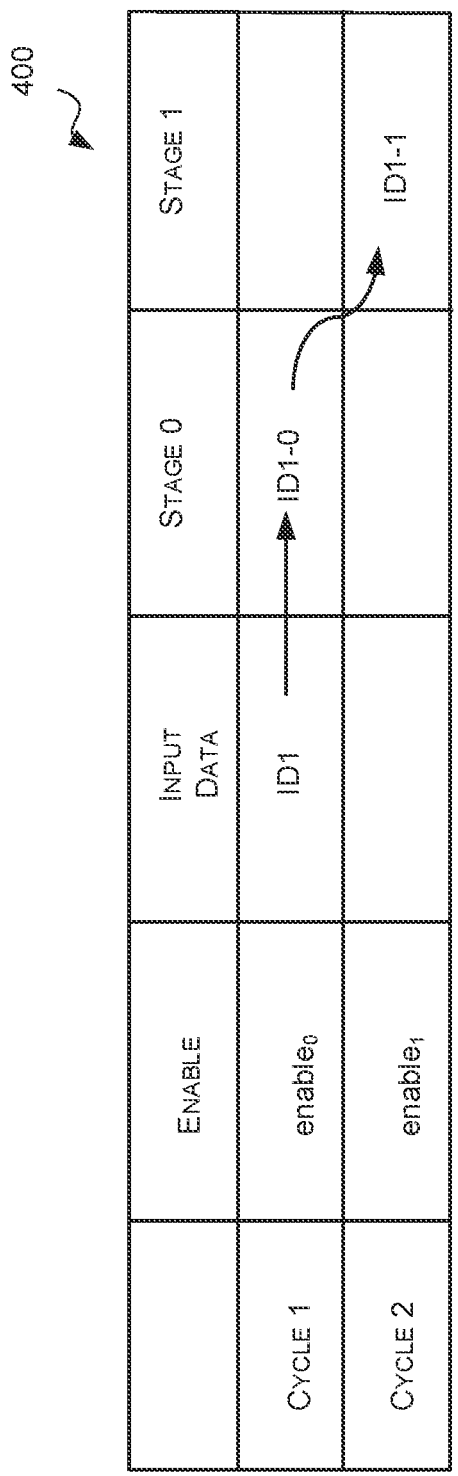
FIG. 4 is a chart illustrating the flow of data through an example multi-stage component when there are no stalls.
Figure 5:
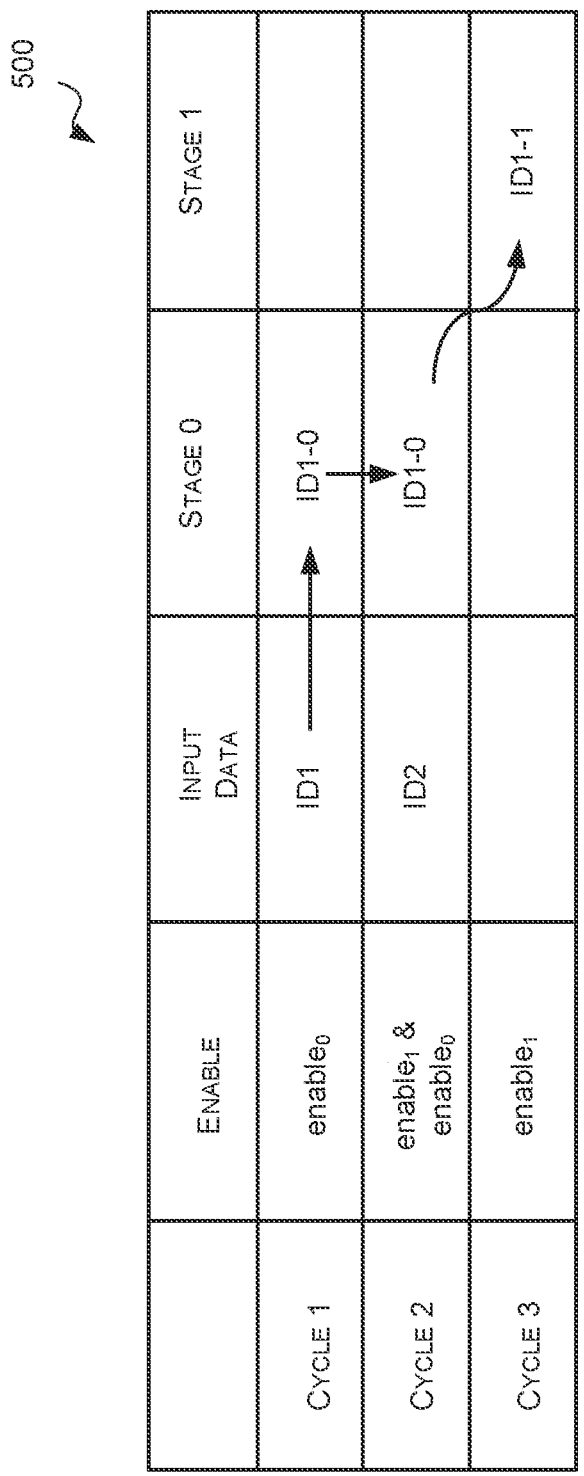
FIG. 5 is a chart illustrating the flow of data through an example multi-stage component when there is a stall which does not cause the relevant data to be overwritten.
Figure 6:
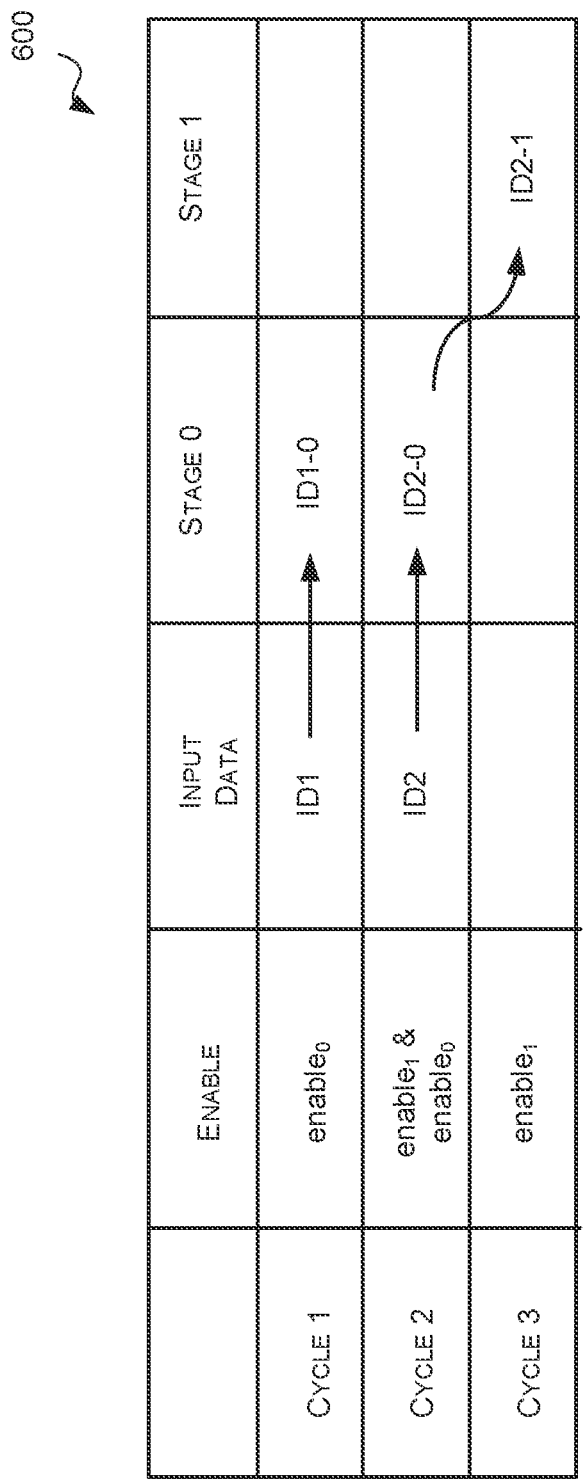
FIG. 6 is a chart illustrating the flow of data through an example multi-stage component when there is a stall which causes the relevant data to be overwritten.

This is explained in more detail using FIGS. 4 to 6. Specifically, FIGS. 4 to 6 show the flow of data through an example multi-stage component that comprises two stages—Stage 0 and Stage 1—for three different enable scenarios. Specifically, FIG. 4 illustrates, at 400, the flow of data through the multi-stage component when there are no stalls. In this example in cycle 1 the multi-stage component receives input data (ID1) and stage 0 is enabled, this causes stage 0 to process the input data (ID1) to generate output data (ID1-0); and in cycle 2 stage 1 is enabled which causes stage 1 to process the output of stage 0 (ID1-0) to generate output data (ID1-1). Accordingly, in this example the output data relates to the initial input data (ID1).

FIG. 5 illustrates, at 500, the flow of data through the multi-stage component when there is a stall of stage 1 which does not cause the relevant data to be overwritten. In this example, in cycle 1 the multi-stage component receives first input data (ID1) and stage 0 is enabled, this causes stage 0 to process the input data (ID1) to generate output data (ID1-0). In cycle 2 the multi-stage component receives second input data (ID2), and neither stage 0 nor stage 1 is enabled. Since neither stage is enabled, neither stage 0 nor stage 1 process new data and thus their output data remains the same as the previous cycle. In cycle 3 stage 1 is enabled which causes stage 1 to process the output of stage 0 (ID1-0) to generate output data (ID1-1). Accordingly, in this example the output of stage 1 in cycle 3 is expected to be the same as the output of stage 1 in cycle 2 of the example of FIG. 4.

FIG. 6 illustrates, at 600, the flow of data through the multi-stage component when there is a stall of stage 1 which causes the relevant data to be overwritten. In this example, in cycle 1 the multi-stage component receives first input data (ID1) and stage 0 is enabled, this causes stage 0 to process the input data (ID1) to generate output data (ID1-0). In cycle 2 the multi-stage component receives second input data (ID2), stage 1 is not enabled, but stage 0 is enabled. Since stage 1 is not enabled stage 1 does not process new data and its output data remains the same. However, since stage 0 is enabled stage 0 processes the new input data (ID2) to generate new output data (ID2-0). Where the output data is stored in a register the output data related to the new input data (ID2-0) overwrites the output data related to the original input data (ID1-0). In cycle 3, stage 1 is enabled which causes stage 1 to process the output of stage 0 (ID2-0) to generate output data (ID2-1). Accordingly, in this example the stall causes the output data related to the initial input data (ID1) to be overwritten thus the output of stage 1 in cycle 3 may be different than the output of stage 1 in cycle 2 of the example of FIG. 4.

Formally verifying Property 2 for a particular stage of the multi-stage component may comprise formally verifying one or more formal assertions are true, or hold, for the hardware design under one or more constraints which, if verified to be true, establish Property 2.

An example set of SVA assertions and constraints for verifying Property 2 for the last stage of a multi-stage component is shown below using two copies of the same design. In this example impl1 is the instantiation of the first copy of a hardware design for a multi-stage component with n stages where the stages are numbered from 0 to n−1; impl2 is the instantiation of the second copy of the hardware design; impli . . . (c) refers to the $c^{th}$ cycle of the instantiation of the $i^{th}$ copy of the hardware design; impli.state . . . is the state of the instantiation of the $i^{th}$ copy of the hardware design; impli.enable$_k$ . . . is the enable signal for the $k^{th}$ stage of the instantiation of the $i^{th}$ copy of the hardware design; and impli.output . . . is the output of the instantiation of the $i^{th}$ copy of the hardware design.

assume property impl1.state(1)=impl2.state(1);
assume property impl1.enable$_{n-1}$(1)=1;
assume property impl2.enable$_{n-1}$(1)=0;
assume property impl2.enable$_{n-2}$(1)=0;
assume property impl2.enable$_{n-1}$(2)=1;
assert property impl1.output(2)=impl2.output(3);

It will be evident to a person of skill in the art that: (i) the first assume statement states that in the first cycle (cycle 1) the instantiations are in the same state (i.e. the instantiations start in the same state); (ii) the second assume statement states that in the first cycle (cycle 1) the last stage of the instantiation of the first copy of the hardware design is enabled; (iii) the third assume statement states that in the first cycle (cycle 1) the last stage of the instantiation of the second copy of the hardware design is not enabled (i.e. stalled); (iv) the fourth assume statement states that in the first cycle (cycle 1) the next to last stage of the instantiation of the second copy of the hardware design is also not enabled (i.e. stalled); (v) the fifth assume statement states that in the second cycle (cycle 2) the last stage of the instantiation of the second copy of the hardware design is enabled; and (vi) the assertion states that the output of the instantiation of the first copy of the hardware design in the second cycle is equal to the output of the instantiation of the second copy of the hardware design in the third cycle.

Essentially the assume statements cause: the instantiations of the two copies of the hardware design to start in the same state; the last stage of the instantiation of the first copy of the hardware design to be enabled in the first cycle so that an output corresponding to that initial starting state will be generated in the second cycle; and the last stage and the next to last stage of the instantiation of the second copy of the hardware design to be stalled (i.e. not enabled) in the first cycle, and the last stage to be enabled in the second cycle so that an output corresponding to that initial starting state will be generated in the third cycle. The assertion then compares the outputs in the second and third cycles of the instantiation of the first and second copies of the hardware design respectively to ensure they match. The formal verification tool can be configured to verify that the assertion is true for all possible starting states, and all possible inputs that cause the last stage and the next to last stage to be stalled. As described in more detail below in the mathematical proof section of the application, the assertion may only need to be verified for one set of inputs which enable the last stage. It will be evident to a person of skill in the art that this is an example only and that other assertions and assumption statements may be used to verify Property 2 for the last stage.

An example set of SVA assertions and constraints for verifying Property 2 for the next to last stage of a multi-stage component is shown below using two copies of the same design:

assume property impl1.state(1)=impl2.state(1);
assume property impl1.enable$_{n-2}$(1)=1;
assume property impl1.enable$_{n-1}$(2)=1;
assume property impl2.enable$_{n-2}$(1)=0;
assume property impl2.enable$_{n-3}$(1)=0;
assume property impl2.enable$_{n-2}$(2)=1;
assume property impl2.enable$_{n-1}$(3)=1;
assert property impl1.output(3)=impl2.output(4);

It will be evident to a person of skill in the art that: (i) the first assume statement states that in the first cycle (cycle 1) the instantiations are in the same state (i.e. the instantiations start in the same state); (ii) the second assume statement states that in the first cycle (cycle 1) the second to last stage (the $(n-2)^{th}$ stage) of the instantiation of the first copy of the hardware design is enabled; (iii) the third assume statement states that in the second cycle (cycle 2) the last stage (the $(n-1)^{th}$ stage) of the instantiation of the first copy of the hardware design is enabled; (iv) the fourth assume statement states that in the first cycle (cycle 1) the second to last stage (the $(n-2)^{th}$ stage) of the instantiation of the second copy of the hardware design is not enabled (i.e. stalled); (v) the fifth assume statement states that in the first cycle (cycle 1) the third to last stage (the $(n-3)^{th}$ stage) of the instantiation of the second copy of the hardware design is also not enabled; (vi) the sixth assume statement states that in the second cycle (cycle 2) the second to last stage (the $(n-2)^{th}$ stage) of the instantiation of the second copy of the hardware design is enabled; (vii) the seventh assume statement states that in the third cycle (cycle 3) the last stage (the $(n-1)^{th}$ stage) of the instantiation of the second copy of the hardware design is enabled; and (viii) the assertion states that the output of the instantiation of the first copy of the hardware design in the third cycle is equal to the output of the instantiation of the second copy of the hardware design in the fourth cycle.

The assume statements cause: the instantiations of the two copies of the hardware design to start in the same state; the second last stage and the last stage of the instantiation of the first copy of the hardware design to be enabled in first and second cycles respectively so that an output corresponding to that initial starting state will be generated in the third cycle; and the second to last and the third to last stage of the instantiation of the second copy of the hardware design to be stalled in the first cycle, the next to last stage and the last stage to be enabled in the second and third cycles respectively so that an output corresponding to that initial starting state will be generated in the fourth cycle. The assertion then compares the outputs in the third and fourth cycles of the instantiations of the first and second copies of the hardware design respectively to ensure they match. The formal verification tool can be configured to verify the assertion for all possible starting states, and all possible inputs that cause the second to last stage and the third to last stage to be stalled. As described in more detail below in the mathematical proof section, the assertion may only need to be verified for one sequence of inputs which enable the second to last and last stages. It will be evident to a person of skill in the art that this is an example only and that other assertions and assumption statements may be used to verify Property 2 for the second to last stage.

The verification of Property 2 for the stages of the multi-stage component may be performed sequentially or in parallel, and in any order. For example, Property 2 may be verified for the stages in order, starting with the last stage (e.g. verify Property 2 for the last stage, verify Property 2 for the second last stage . . . verify Property 2 for the second stage). In other examples, Property 2 may be verified for each of the relevant stages in parallel (e.g. verify Property 2 for second stage, verify Property 2 for the third stage . . . verify Property 2 for the last stage all in parallel).

Once Property 2 has been verified for each stage from the second stage to the last stage, the method 300 may end or the method 300 may proceed to block 308.

At block 308, the formal verification tool used to perform the verification may output one or more signals that indicate whether the verifications were successful. For example, when the formal verification tool is used to verify an assertion, the formal verification tool may output a signal that indicates whether or not the assertion is true (i.e. the asserted property is true for all valid states or sequence of states of the hardware design), which may also be referred to herein as the assertion being successfully verified. The output may be yes, the assertion is valid or has been successfully verified; no, the assertion is not valid (i.e. it is not true or has failed for at least one valid state or sequence of states) or has not been successfully verified; or the formal verification was inconclusive. The formal verification may be inconclusive, for example, because the computing-device running the formal verification tool has run out of memory or because the formal verification tool has determined that a certain amount of progress has not been made after a predefined period of time.

Where an assertion is not valid or has not been successfully verified the formal verification tool may also output information indicating a state or a sequence of states of the hardware design which cause the assertion to fail (e.g. the formal verification tool may output information indicating a counterexample to the assertion). For example, the formal verification tool may output a trace of the verification indicating at what point, state or sequence of states the failure occurred. Once a signal has been output indicating whether the verifications were successful the method 300 may end or the method 300 may proceed to block 310.

At block 310, a determination may be made as to whether the output signal(s) indicate that the verifications were successful. If the output signal(s) indicate that the verifications were successful indicating that an instantiation of the hardware design is stall independent, then the method 300 may proceed to block 314 where the multi-stage component defined by the hardware design is implemented in hardware. If, however the output signal(s) indicate that at least one of the verifications was not successful indicating that an instantiation of the hardware design is not stall independent then the method 300 may proceed to block 312 where the hardware design is modified to correct an error in the hardware design that caused the unexpected behaviour. In some cases, the hardware design may be modified based on the information indicating a state or a sequence of states of the hardware design which cause the assertion to fail (e.g. based on the counterexample). Once the hardware design has been modified the modified hardware design may be re-verified (e.g. blocks 302-310 may be repeated for the modified hardware design).

Although in the example method 300 of FIG. 3, blocks 304 and 306 are executed sequentially, in other examples they may be executed in the reverse order (e.g. block 306 may be executed before block 304), they may be executed in parallel or the verifications performed in each block may be interleaved. For example, Property 1 may be verified for some of the stages, Property 2 may be verified for some of the stages, Property 1 may then be verified for the remaining stages, then Property 2 may be verified for the remaining stages.

Although in the example method 300 of FIG. 3 the verifications described with respect to blocks 304 and 306 are completed via formal verification, in other examples the verifications may be completed via other suitable verification methods. For example, alternatively one or more of the verifications described with respect to blocks 304 and 306 may be implemented via simulation-based verification. However, implementing block 304 or 306 via simulation-based verification may comprise verifying via simulation 'Property 1' and/or 'Property 2' for each possible starting state of the multi-stage component and each possible input to the multi-stage component. In other words, implementing block 304 or 306 via simulation-based verification may comprise verifying 'Property 1' or 'Property 2' for (number of possible starting states of the multi-stage component)* (number of possible inputs for the multi-stage component) different simulation scenarios. Depending on the type of component, the number of possible starting states and/or the number of inputs can be quite large which may make performing block 304 and/or block 306 via simulation intractable.

Non-Relevant Outputs

As described above, in some cases, the relevant portion of the output data will be all of the output data. However, in other cases, a multi-stage component may have multiple operating modes wherein in at least one of the operating modes not all of the outputs are needed. When a multi-stage component is operating in such a mode it may allow the component to output anything (e.g. junk) in the non-relevant portions of the output data. Accordingly, when a multi-stage component is operating in such a mode the output data generated when a set of input data is processed by the multi-stage component may be different for input sequences with different stalls.

For example, if there is a multi-stage component F with three stages—Stage 0, Stage 1 and Stage 2—which, in addition to the enable signal(s), receives two inputs a and b, wherein a is a non-negative integer (i.e. a∈N), and b can be 0 or 1. The output of the component F is (f(a), g(a)) wherein g(a) is only updated when b=1. When b=0, g(a) is not updated thus g(a) can be anything (i.e. it can have 'junk').

Figure 7:
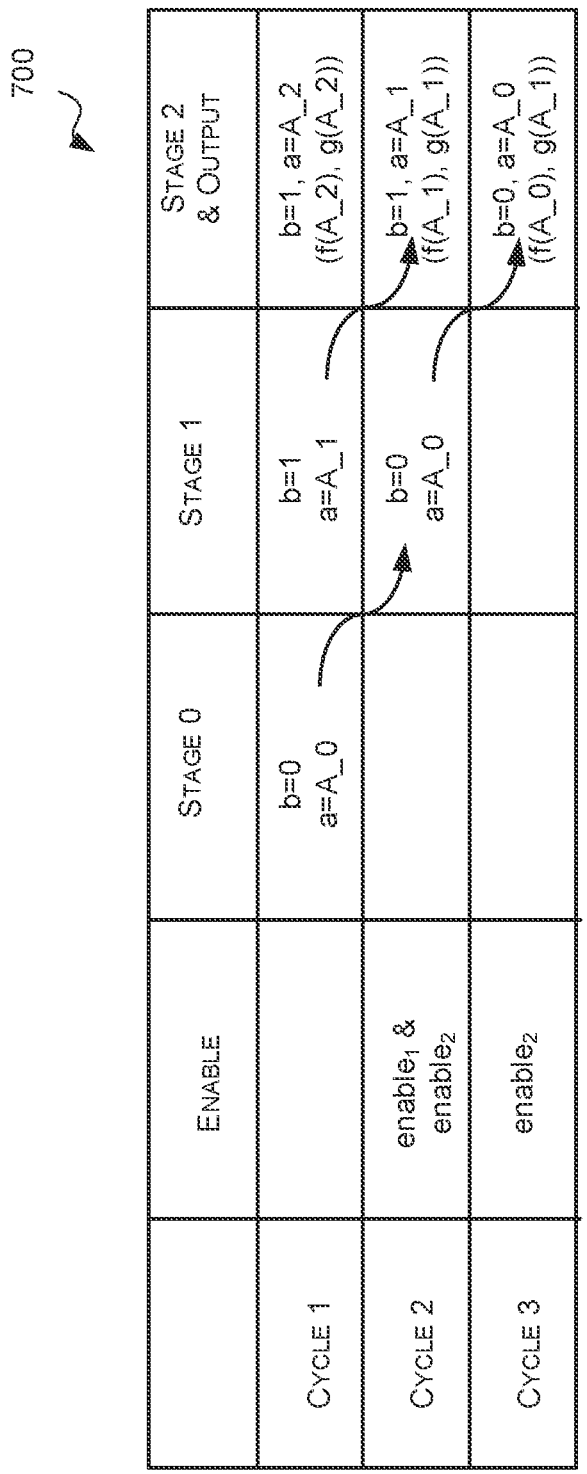
FIG. 7 is a chart illustrating a first example flow of data through an example multi-stage component that can operate in a mode in which some of the outputs are not relevant.
Figure 8:
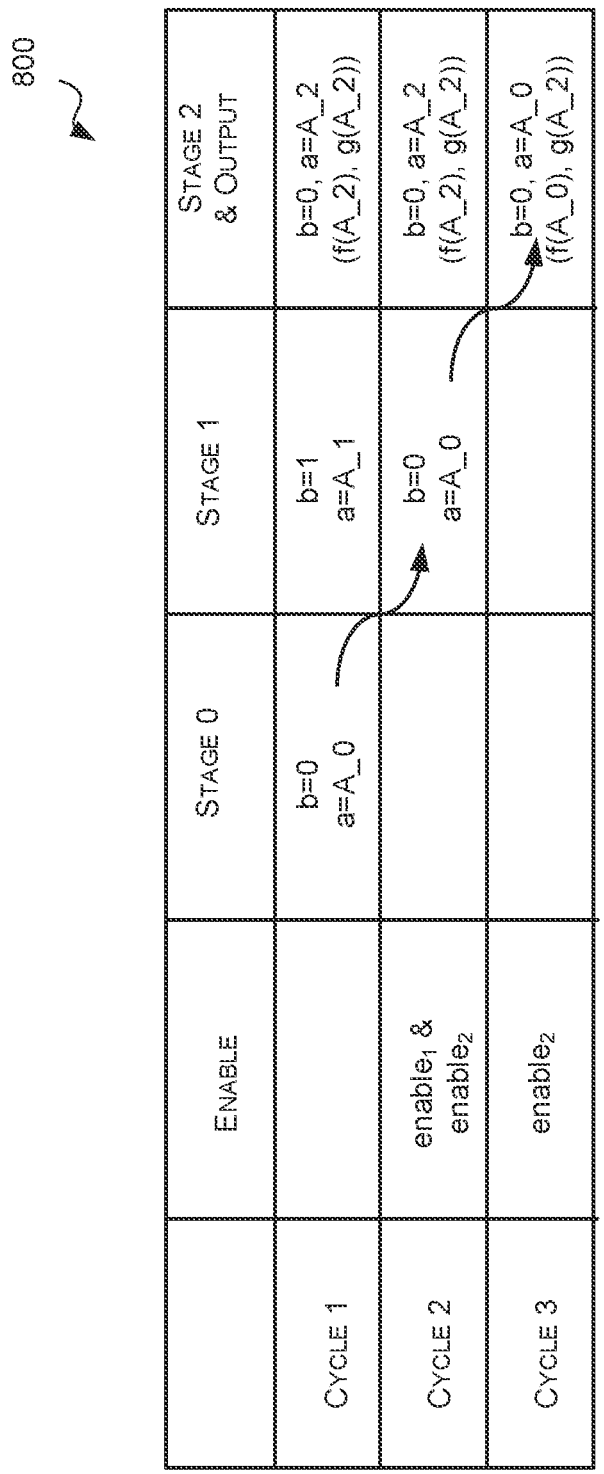
FIG. 8 is a chart illustrating a second example flow of data through the example multi-stage component of FIG. 7.

This means that Properties 1 and 2 may not hold for such a design for all stages if all of the output data is defined as the relevant portion of the output data. For example, FIGS. 7 and 8 show example sequences of inputs wherein Property 1 does not hold for Stage 1 if all of the output data is considered to be the relevant portion of the output data. Specifically FIG. 7 illustrates, at 700, an example wherein at the beginning of cycle 2 the state of the component is as follows: the output of stage 0 corresponds to an input of b=0 and a=A_0; the output of stage 1 corresponds to an input of b=1 and a=A_1; and the output of stage 2 corresponds to b=1 and a=A_2 which results in an output of f(A_2) and g(A_2). In cycle 2, stage 1 is enabled which causes stage 1 to generate an output corresponding to an input of b=0 and a=A_0; and stage 2 is enabled which causes stage 2 to generate an output corresponding to b=1 and a=A_1 which results in an output f(A_1) and g(A_1). In cycle 3, stage 2 is enabled which causes stage 2 to generate an output corresponding to an input of b=0 and a=A_0 which results in an output of f(A_0) and g(A_1). Specifically, since b=0, g(a) is irrelevant and so is not updated.

FIG. 8 illustrates, at 800, an example wherein at the beginning of cycle 2 the state of the component is the same as at the beginning of cycle 2 of FIG. 7.—i.e. the output of stage 0 corresponds to an input of b=0 and a=A_0; the output of stage 1 corresponds to an input of b=1 and a=A_1; and the output of stage 2 corresponds to an input of b=1 and a=A_2 which results in an output of f(A_2) and g(A_2). In cycle 2, stage 1 is enabled which causes stage 1 to generate an output corresponding to an input of b=0 and a=A_0; and stage 2 is not enabled which causes stage 2 to continue to output f(A_2) and g(A_2). In cycle 3, stage 2 is enabled which causes stage 2 to generate an output corresponding to an input of b=0 and a=A_0 which results in an output of f(A_0) and g(A_2). Specifically, since b=0, g(a) is irrelevant and so is not updated.

Accordingly, FIGS. 7 and 8 illustrate sequences of inputs wherein Property 1 would fail for stage 1 as they illustrate two sets of inputs wherein stage 1 is enabled from the same state and the subsequent stages are enabled in successive cycles wherein the outputs are different.

However, the component is working as expected in both FIGS. 7 and 8 as the relevant output data is the same (i.e. it is only the irrelevant output data that does not match). As a result, if only the relevant portions of the output data are compared then Property 1 will hold. In some cases, the relevant data may be based on the input data and/or the mode in which the component is operating. Where the information indicating the relevant portion of the output is in a register of the final state then that information may be directly used to determine which portions of the output are irrelevant and/or to zero the irrelevant portions of the output data. For example, in FIGS. 7 and 8, there is a register in the final state that stores the value of b and it is known that the g(a) output is only relevant when b=1 so instead of verifying that the output of the component (f(a), g(a)) is always the same for the defined scenarios, it can be verified that (f(a), b*g(a)) is always the same for the defined scenarios as b*g(a) will always be zero when g(a) is irrelevant. It will be evident to a person of skill in the art that this is an example only and that in other examples the inputs and outputs may be related in another manner.

Where the relevant portion of the output data is identified by a register value the method 300 may further comprise, formally verifying, that the register believed to contain the value that identifies the relevant portion of the output does always identify the relevant portion of the output data. If there is no register in the final state that indicates which portion(s) of the output are relevant then, as discussed below, a more complicated mechanism may be used to determine the relevant portion of the output.

Initial State Independence

A hardware design for a multi-stage component that is stall independent may also be initial stage independent. A hardware design is initial state independent if the relevant portion of the output data generated by an instantiation of the hardware design will be the same for the same input data regardless of the initial state of the hardware component. If Properties 1 and 2 are verified for a hardware design for a multi-stage component (i.e. it has been verified that the hardware design is stall independent) it can be verified that the hardware design is initial state independent by formally verifying another property, referred to herein as 'Property 3', for a single sequence of inputs which move that input data through the stages of the component (i.e. for a single minimal sequence of inputs). Property 3 is that the output of the instantiation of the design in response to the same input is the same regardless of the state of the instantiation when the first stage is enabled. For example, it can be verified that the hardware design is initial state independent by verifying Property 3 for only a single sequence of inputs in which the second stage to the last stage are enabled in successive cycles (i.e. for a single sequence of inputs in which there is no stalling).

Formally verifying that the hardware design is initial state independent may comprise formally verifying one or more formal assertions are true, or hold, for the hardware design under one or more constraints, which, if verified to be true, establish (in conjunction with Properties 1 and 2) that the hardware design is initial state independent.

An example set of SVA assertions and constraints for verifying Property 3 for a multi-stage component is shown below using two copies of the same design. In this example impl1 is the instantiation of the first copy of a hardware design for a multi-stage component with 3 stages where the stages are numbered from 0 to 2; impl2 is the instantiation of the second copy of the hardware design; impli.(c) refers to the $c^{th}$ cycle of the instantiation of the $i^{th}$ copy of the hardware design; impl1.inputs . . . refers to all the inputs to the instantiation of the $i^{th}$ copy of the hardware design apart from the enable signal, impli.enable$_k$ . . . is the enable signal for the $k^{th}$ stage of the instantiation of the $i^{th}$ copy of the hardware design; and impli.output . . . is the output of the instantiation of the $i^{th}$ copy of the hardware design.

assume property impl1.inputs(1)=impl2.inputs(1)
assume property impl1.enable$_0$(1)=1;
assume property impl2.enable$_0$(1)=1;
assume property impl1.enable$_1$(2)=1;
assume property impl2.enable$_1$(2)=1;
assume property impl1.enable$_2$(3)=1;
assume property impl2.enable$_2$(3)=1;
assert property impl1.output(4)=impl2.output(4);

It will be evident to a person of skill in the art that: (i) the first assume statement states that in the first cycle (cycle 1) the instantiations receive all the same inputs; (ii) the second assume statement states that in the first cycle (cycle 1) the first stage of the instantiation of the first copy of the hardware design is enabled; (iii) the third assume statement states that in the first cycle (cycle 1) the first stage of the instantiation of the second copy of the hardware design is enabled; (iv) the fourth assume statement states that in the second cycle (cycle 2) the second stage of the instantiation of the first copy of the hardware design is enabled; (v) the fifth assume statement states that in the second cycle (cycle 2) the second stage of the instantiation of the second copy of the hardware design is enabled; (vi) the sixth assume statement states that in the third cycle (cycle 3) the third and final stage of the instantiation of the first copy of the hardware design is enabled; (vii) the seventh assume statement states that in the third cycle (cycle 3) the third and final stage of the instantiation of the second copy of the hardware design is enabled; and (viii) the assertion states that the output of the instantiation of the first copy of the hardware design in the fourth cycle is equal to the output of the instantiation of the second copy of the hardware design in the fourth cycle.

The assume statements cause: the instantiations of the two copies of the hardware design to have the same inputs in the first cycle from the set of inputs wherein the first stage is enabled; and the second and third stages of both instantiations to be enabled in the second and third cycles respectively so that an output corresponding to the input in the first cycle will be generated in the fourth cycle. The assertion then compares the outputs in the fourth cycles of the instantiations of the first and second copies of the hardware design respectively to ensure they match. The formal verification tool can be configured to verify the assertion for all possible starting states, and all possible sets of inputs that cause the first stage to be enabled. As described in more detail below in the mathematical proof section, the assertion may only need to be verified for one sequence of inputs which enable the second stage and third stages in successive cycles. It will be evident to a person of skill in the art that this is an example only and that other assertions and assumption statements may be used to verify Property 3.

Although all of the above sets of assertions and constraints have been written to compare outputs of two instantiations of the same hardware design, it will be evident to a person of skill in the art that each set of assertions and constraints could alternatively be written to compare the output of the same instantiation of the hardware design at two different points in time. Accordingly, the verification may be performed with only a single copy of the hardware design.

System

Figure 9:
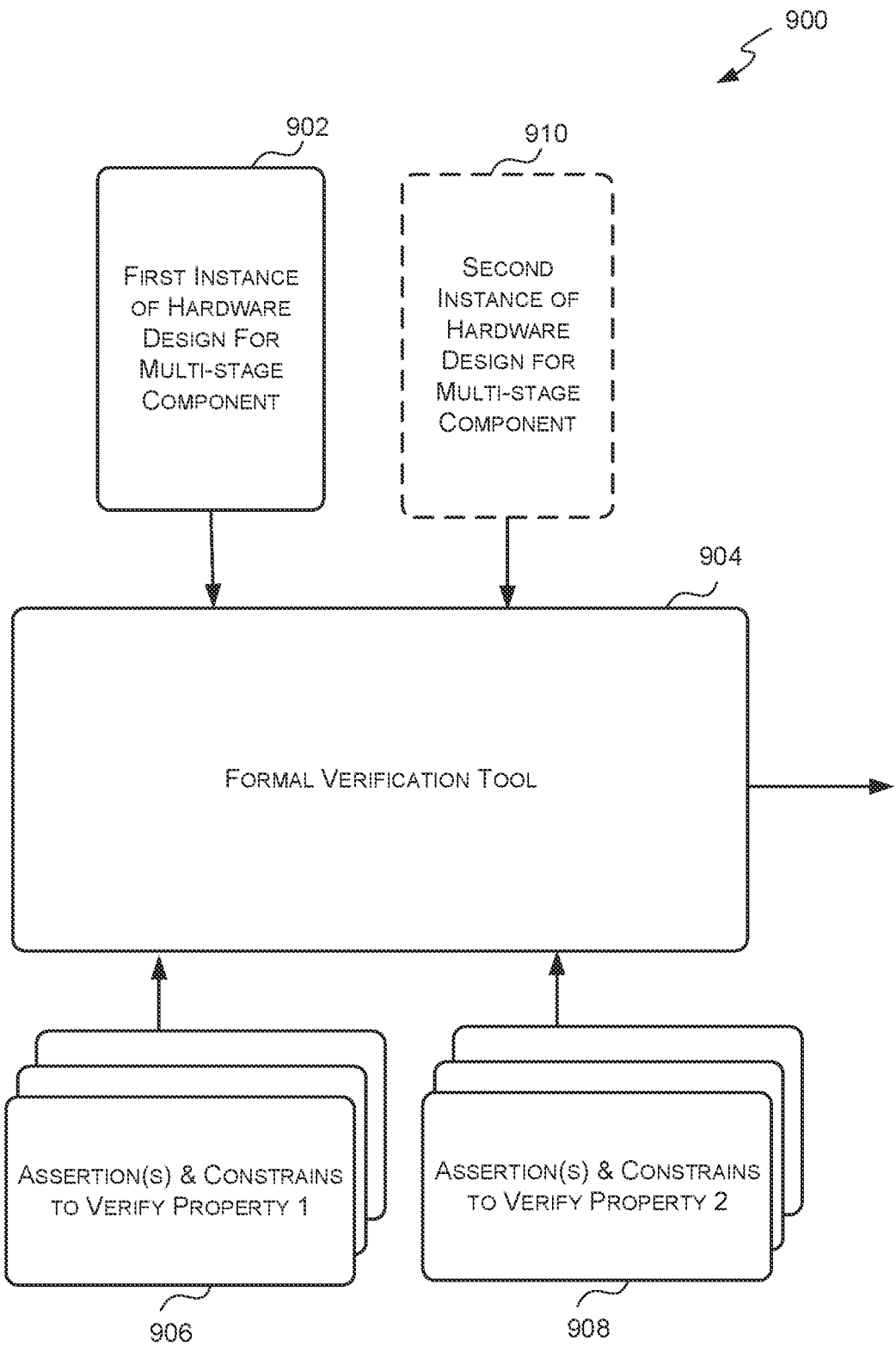
FIG. 9 is a block diagram of an example system for verifying the stall independence of a hardware design for a multi-stage component.

Reference is now made to FIG. 9 which illustrates an example system 900 for implementing the method 300 of FIG. 3. The system 900 may be implemented by one or more computing-based devices, such as the computing-based device 1100 described below with reference to FIG. 11. For example, one or more of the components of the system 900 of FIG. 9 may be implemented as computer-readable instructions that, when executed at a computing-based-device, cause the computing-based device to perform the function of that component described below.

The system 900 comprises a hardware design for a multi-stage component 902; a formal verification tool 904; a set of assertions and constraints 906 to verify Property 1 for each stage from the second stage to the last stage; and a set of assertions and constraints 908 to verify Property 2 for each stage from the second stage to the last stage. Depending on the format of the assertions the system 900 may also comprise a second instance of the hardware design 910 and/or a model of the hardware design. Specifically, if one or more of the assertions compares the output of an instantiation of the hardware design to another instantiation of the hardware design then the system 900 may comprise a second instance of the hardware design, and if one or more of the assertions compares the output of an instantiation of the hardware design to the output of a model of the hardware design then the system 900 may comprise a model of the hardware design. In general, the formal verification tool 904 is configured to formally verify the assertions are true for the hardware design under the associated constraints using mathematical reasoning.

As described above, a hardware design is a description of the structure and/or function of an integrated circuit, which, when processed at an integrated circuit manufacturing system, causes the integrated circuit manufacturing system to generate an integrated circuit described by the hardware design. Accordingly, a hardware design 902, 910 for a multi-stage component is a description of the structure and/or function of an integrated circuit that embodies a multi-stage component, which, when processed at an integrated circuit manufacturing system, causes the integrated circuit manufacturing system to generate an integrated circuit that embodies the multi-stage component.

As described above, the formal verification tool 904 is a software tool that is capable of performing formal verification of a hardware design. Formal verification tools include, but are not limited to formal model checkers (which also may be referred to as formal property checkers) which are configured to formally verify a property of a hardware design, and formal equivalence checkers which are configured to formally verify the equivalence of two designs (e.g. two hardware designs, a hardware design and a netlist, or a hardware design and a model of the hardware design etc.).

Although FIG. 9 illustrates a single formal verification tool 904, in other examples the system may comprise multiple formal verification tools which allow the formal verification of the assertions to be performed in parallel. Where there are multiple formal verification tools all of the formal verification tools may be of the same type (e.g. all of the formal verification tools may be formal model checkers or all of the formal verification tools may be formal equivalence checkers), or, two or more of the formal verification tools may be of different types (e.g. at least one of the formal verification tools may be a formal model checker and at least one of the formal verification tools may be a formal equivalence checker). The formal verification tools may be of different types in some cases because it may be more efficient in these cases to verify some of the assertions using a formal model checker and verify other assertions using a formal equivalence checker.

A set of assertions and constraints 906 for verifying Property 1 for a particular stage of the multi-stage component comprises one or more assertions and one or more constraints under which the assertions are to be verified, such that if the one or more assertions are verified to be true for the hardware design under the specified constraints then Property 1 will be verified for that stage. Example sets of assertions and constraints for verifying Property 1 for the last and second to last stages of an example multi-stage component were described above in relation to FIG. 3.

A set of assertions and constraints 908 for verifying Property 2 for a particular stage of the multi-stage component comprises one or more assertions and one or more constrains under which the assertions are to be verified, such that if the one or more assertions are verified to be true for the hardware design under the specified constrains then Property 2 will be verified for that stage. Example sets of assertions and constraints for verifying Property 2 for the last and second to last stages of an example multi-stage component were described above in relation to FIG. 3.

Each set of assertions and constraints 906, 908 is linked to the appropriate hardware design(s) 902, 910 and/or model to be able to verify the asserted properties. A set of assertions and constraints 906, 908 may be linked to a hardware design by, for example, incorporating the set of assertions and constraints into the hardware design or binding the set of assertions and constraints to the relevant signals of the hardware design. The hardware design(s), model (if required), assertions and constraints for verifying Property 1, assertions and constraints for verifying Property 2, and bindings (if required) are then loaded into the formal verification tool (or formal verification tools). The formal verification tool is then configured to verify each set of assertions for the hardware design under the associated constraints. In other words, the formal verification tool is configured to formally verify each set of assertions for Property 1 are true for the hardware design under the corresponding constraints; and formally verify each set of assertions for Property 2 are true for the hardware design under the corresponding constraints. Where there are a plurality of formal verification tools, two or more of the assertion verifications may be performed in parallel to reduce the time to complete the verification.

As described above, in formal verification the hardware design is transformed into a mathematical model (e.g. a state transition system, or a flow graph) to thereby provide an instantiation of the hardware design which can be tested to verify the hardware design, and the formal properties to be verified (e.g. the asserted properties) are expressed using mathematical logic using a precise syntax or language with a precise mathematical syntax and semantics.

A formal assertion is verified by searching the entire reachable state space of the instantiation of the hardware design (e.g. state-transition system, or flow graph) without explicitly traversing all the states. The search is done by, for example, encoding the states using efficient Boolean encodings using Binary decision diagrams (BDDS), or using advanced SAT (satisfiability-based bounded model checking) based techniques. In some cases, tools can be used to implement techniques, such as, but not limited to, abstraction, symmetry, symbolic indexing, and invariants to improve performance and achieve scalability.

When a formal verification tool 904 is used to verify an assertion, the formal verification tool 904 may output an indication of whether or not the assertion is valid (i.e. the asserted property is true for all valid states or sequence of states), which may also be referred to herein as the assertion being successfully verified. The output may be yes, the assertion is valid or has been successfully verified; no, the assertion is not valid (i.e. it is not true or has failed for at least one valid state or sequence of states) or has not been successfully verified; or the formal verification was inconclusive. The formal verification may be inconclusive, for example, because the computing-based device running the formal verification tool 904 has run out of memory or because the formal verification tool 904 has determined that a certain amount of progress has not been made after a predefined period of time.

Where an assertion is not valid or has not been successfully verified, the formal verification tool 904 may also output information indicating a state or sequence of states of the hardware design which causes the assertion to fail (e.g. the formal verification tool may output a counterexample). For example, the formal verification tool 904 may output a trace of the verification indicating at what point, state or sequence of states the failure occurred.

Where one of the verifications is performed via other verification methods the system may additionally, or alternatively, comprise one or more other verification tools. For example, where one or more of the verifications is performed via simulation-based verification the system may comprise a simulation engine.

As is known to those of skill in the art, a simulation engine is a software tool capable of performing simulation-based verification of a hardware design. In particular, a simulation engine monitors the output of one or more instantiations of the hardware design in response to each input vector in a test set and compares the outputs to known expected outputs to determine if the instantiation is behaving as expected.

A simulation engine may perform the simulation-based verification using any known method. For example, the simulation engine may receive the hardware design in, for example HDL, convert the HDL to another language, such as C, and perform the simulation on the C code; the simulation engine may receive the hardware design as, for example, HDL and perform the simulation directly on the HDL; or the simulation engine may implement the hardware design in hardware and perform the simulation on the hardware. Once the simulation is complete the simulation engine may output an indication of whether or not the hardware design passed the simulation.

Mathematical Proof

A mathematical proof that establishes that verifying the properties of blocks 304 and 306 for all stages of the multi-stage component from the second stage to the last stage verifies that the hardware design for the multi-stage component is stall independent is now provided.

Notation

Let the multi-stage component comprise n stages wherein n is an integer greater than or equal to two and the stages are numbered from 0 to n−1. Let the multi-stage component receive an n-bit enable signal, denoted enable, each cycle which indicates which of the stages are enabled in that cycle. Specifically, the $i^{th}$ bit of the enable signal, denoted $enable_i$, indicates whether the $i^{th}$ stage is enabled in the current cycle. In this example, when $enable_i$ is a '1' the $i^{th}$ stage is enabled and when $enable_i$ is a '0' the $i^{th}$ stage is not enabled. As described above, when a stage is enabled that stage receives and processes the data output from the previous stage to generate output data.

Let $\Omega$ denote the set of all states in which the multi-stage component can be in as shown in equation (1). The term "state of the component" is used herein to describe the variable elements of the component, and their current values. In some cases, the state of the multi-stage component may be described by the current values of the registers of the multi-stage component.

$$\Omega = \{\text{all states the multistage component can be in}\} \quad (1)$$

Let E' denote the set of all inputs to the multi-stage component which do not cause an error with the multi-stage component as shown in equation (2). A set of inputs is said to cause an error with the multi-stage component if it causes the multi-stage component to stop processing data. An example of an input which might cause the component to stop processing data is a reset command. Let E be a subset of E' which is used for the verification.

$$E' = \{\text{all inputs to the multistage component that do not cause an error}\} \quad (2)$$

$$E = \{\text{all relevant inputs to the multistage component for the verification}\} = \subset E' \quad (3)$$

The inputs to the multi-stage component include the input data and the enable signal. For a set of inputs e∈E the enable signal thereof is denoted e.enable.

An action of E on $\Omega$ is defined by defining ex to be the state reached by the component after processing the input e when the component starts in state x.

Let X be a set of states which is closed under the action of E such that if the multi-stage component is in a state x∈X and e∈E is a set of relevant inputs, then after processing the inputs e the component will be in a state in X. In general, showing that a set of states is closed under the action of processing a set of inputs is a difficult problem. Accordingly, in most cases X is selected to be $\Omega$ and E is selected to be E'. However, as $\Omega$ may include invalid states (e.g. states that may not be reachable by processing valid inputs) this may cause problems for some designs and so X may need to be restricted to a subset of Ω. Example cases where this may occur are described below. If X includes all of the initial states of the component, then it will contain all reachable states. If, however, the selected X does not include all initial states then to fully verify the stalling independence of a design using the technique described herein additional verification may be performed to show that the component is stall independent under normal operation.

Let $E_i \subset E$ be the set of inputs where the $i^{th}$ stage is enabled (i.e. enable$_i$=1 indicates that the $i^{th}$ stage is enabled) as shown in equation (4) and $\overline{E}_i \subset E$ be the set of inputs where the $i^{th}$ stage is not enabled (i.e. enable$_i$=0 indicates that the $i^{th}$ stage is not enabled) as shown in equation (5).

$$E_i = \{e \in E | e.\text{enable}_i = 1\} \quad (4)$$

$$\overline{E}_i = \{e \in E | e.\text{enable}_i = 0\} \quad (5)$$

Let Y denote the collection of outputs for the multi-stage component. Let $\phi: X \to Y$ be the function which takes the state of the multi-stage component and produces the output at this state.

In this notation, the multi-stage component would normally start in cycle 1 in some state, $x \in X$ and then be provided with an input in which stage 0 is enabled (i.e. some input $e_0 \in E_0$). After processing the input in the second cycle the multi-stage component will be in state $e_0 x$. If in the next cycle the multi-stage component is provided with an input wherein stage 1 is enabled (i.e. some input $e_1 \in E_1$) then after processing the input in the third cycle the multi-stage component will be in state $e_1 e_0 x$. If, however, there is stalling of stage 1 in the next cycle—i.e. if in the next cycle the multi-stage component receives an input in which the 1$^{st}$ stage is not enabled (i.e. some input $\overline{e}_1 \in \overline{E}_1$)—then after processing the input in the third cycle the multi-stage component will be in a state $\overline{e}_1 e_0 x$.

There can be an arbitrary number of cycles in which stage 1 is not enabled or stalled. However, to get an output, eventually stage 1 is enabled (i.e. eventually the multi-stage component receives some input $e_1 \in E_1$). Let $\overline{e}_1^{\,1}, \ldots \overline{e}_1^{\,m} \in \overline{E}_1$ denote the inputs in the cycles in which stage 1 is not enabled or stalled with input $\overline{e}_1^{\,m}$ being the first to be received of the set, followed by input $\overline{e}_1^{\,m-1}$ and so on. Therefore after m cycles of stalling of stage 1 the multi-stage component will be in state $e_1 \overline{e}_1^{\,1} \ldots \overline{e}_1^{\,m} e_0 x$.

This continues for each subsequent stage until the multi-stage component has reached a state in which the data corresponding to the first input has been processed by all stages of the multi-stage component and an output corresponding thereto is output from the multi-stage component. If there is no stalling the final state x' can be expressed as shown in equation (6) for some $x \in X$ and $e_i \in E_i$. The map $\phi$ can then be applied to the final state x' to determine the output that corresponds to this state.

$$x' = e_{n-1} e_{n-2} \ldots e_1 e_0 x \quad (6)$$

If, however, there is stalling then the final state x" can be expressed as shown in equation (7) for some $x \in X$, i=0, ..., n-1, $m_i \in \mathbb{N}$, j=1, ..., $m_i$, $e_i \in E_i$ and $\overline{e}_i^{\,j} \in \overline{E}_i$.

$$x'' = e_{n-1} \overline{e}_{n-1}^{\,1} \ldots \overline{e} e_{n-1}^{\,m_{n-1}} e_{n-2} \ldots e_1 \overline{e}_1^{\,1} \overline{e}_1^{\,m_1} e_0 x \quad (7)$$

In some cases, the multi-stage component will be operating as expected when the output corresponding to state x' (i.e. $\phi(x')$) will be the same as the output corresponding to state x" (i.e. $\phi(x')$). However, in other cases the multi-stage component will be operating as expected when the output corresponding to state x' (i. e. $\phi(x')$) is not the same as the output corresponding to state x" (i. e. $\phi(x'')$). Specifically, $\phi(x') = \phi(x'')$ if and only if when each stage is enabled in (7), the data output from the previous stage corresponds to the original input. This will not be true if the previous stage (stage i) receives and processes new data prior to that stage (stage i+1) being enabled. This may occur if both that stage (stage i+1) is stalled and the previous stage (stage i) is enabled in the same cycle (i.e. for any $\overline{e}_{i+1}^{\,j} \in \overline{E}_{i+1} \cap E_i$). This was described in reference to FIGS. 4 to 6.

A sequence of inputs e which is expected to progress the data through each stage of a set of stages is referred to herein as a minimal sequence of inputs, $e_{min}$. For example, for a set comprising three stages numbered 0 to 2 a minimal sequence of inputs is expected to progress input data A1 to stage 0, subsequently progress A1 to stage 1, and subsequently progress A1 to stage 2. There may or may not be stalls between progressing the data between stages, but in a minimal sequence there is no risk of A1 being overwritten. Accordingly, any minimal sequence of inputs is expected to cause the multi-stage component to produce the same output for the same initial input. A sequence of inputs is said to be a minimal sequence of inputs $e_{min}$ if it can be written in the form shown in equation (8)

$$e_{min} = e_{n-1} \overline{e}_{n-1}^{\,1} \ldots \overline{e} e_{n-1}^{\,m_{n-1}} e_{n-2} \overline{e}_{n-2}^{\,1} \ldots \\ \overline{e} e_{n-2}^{\,m_{n-2}} e_1 \overline{e}_1^{\,1} \ldots \overline{e}_1^{\,m_1} e_0 \quad (8)$$

for some $x \in X$, i=0, n-1, $m_i \in \mathbb{N}$, j=1, ..., $m_i$, $e_i \in E_i$ and $\overline{e}_i^{\,j} \in \overline{E}_i \cap \overline{E}_{i-1}$. The term minimal sequence of inputs includes a sequence of inputs where the stages are enabled in successive cycles (i.e. a sequence of inputs with no stalling, such as, $e_{n-1} e_{n-2} \ldots e_1 e_0$).

As described above, a hardware design for a multi-stage component is said to be stall independent if an instantiation of the hardware design will generate the same output in response to the same input data if starting from the same state of the hardware design regardless of the number and or location of stalls that occur when processing that input data. In other words, a hardware design for a multi-stage component is stall independent if for any minimal sequences of inputs $e_{min}$ and $e'_{min}$ with the same initial input ($e_0 = e'_0$) an instantiation of the hardware design will generate the same output data when starting from the same state $x \in X$ of the multi-stage component (i.e. $\phi(e_{min} x) = \phi(e'_{min} x)$).

As described above, a hardware design for a multi-stage component that is stall independent may also be initial state independent if an instantiation of the hardware design will generate the same output in response to the same input sequence regardless of the initial state of the hardware component. In other words, a hardware design for a multi-stage component is initial state independent if for any minimal sequence of inputs $e_{min}$ an instantiation of the hardware design will generate the same output data from any initial states x,x'$\in$X of the multi-stage component ($\phi(e_{min} x) = \phi(e_{min} x')$).

Proof

An inductive proof as to why verifying the properties of blocks 304 and 306 for each stage of a hardware design for a multi-stage component verifies that the hardware design is stall independent is now provided. As described above, a hardware design for a multi-stage component is stall independent if for any minimal sequences of inputs $e_{min}$ and $e'_{min}$ with the same initial input ($e_0 = e'_0$) an instantiation of the hardware design will generate the same output data when starting from the same state $x \in X$ of the multi-stage component. This is expressed in equation (9):

$$\phi(e_{min} x) = \phi(e'_{min} x) \text{ for all } x \in X \text{ and for all } e_{min} \text{ and} \\ e'_{min} \text{ wherein } e_0 = e'_0 \quad (9)$$

The proof starts with the last (i.e. $(n-1)^{th}$) stage of the multi-stage component.

Property 1 (Block 304)—($(n-1)^{th}$ stage): The output of an instantiation of the hardware design is the same if the instantiation is in the same state ($x \in X$) when the $(n-1)^{th}$ stage is enabled by any set of inputs (i.e. any $e_{n-1} \in E_{n-1}$). This is expressed in equation (10).

$$\phi(e_{n-1}x) = \phi(e'_{n-1}x) \text{ for all } x \in X \text{ and for all } e_{n-1}, e'_{n-1} \in E_{n-1} \quad (10)$$

Verifying Property 1 for the last stage verifies that the only input that matters for the last stage is the input enabling the last stage.

Property 2 (Block 306)— ($(n-1)^{th}$ stage): That the output of an instantiation of the hardware design if the instantiation is in a particular state ($x \in X$) when the $(n-1)^{th}$ stage is enabled is the same as the output of the instantiation if the instantiation is in that particular state when the $(n-1)^{th}$ stage is stalled and the $(n-1)^{th}$ stage is enabled in the next cycle. This is expressed in equation (11).

$$\phi E_{n-1}(x) = \phi E_{n-1}(\bar{e}_{n-1}x) \text{ for all } x \in X \text{ and for all } \bar{e}_{n-1} \in \bar{E}_{n-1} \cap \bar{E}_{n-2} \quad (11)$$

Verifying Property 2 for the last stage verifies that any stalls of the last (i.e. $(n-1)^{th}$) stage that precede enablement of the last (i.e. $(n-1)^{th}$) stage do not affect the output.

Verifying Properties 1 and 2 for the last stage means that the verification of the previous stages can be simplified. Specifically, as stated above, the objective is to prove the property set out in equation (9). By replacing $e_{min}$ with the formulation of a minimal sequence of inputs, equation (9), can be written as equation (12). Equation (12) can then be written as equation (13) according to the associative property. If Property 1 has been verified for the last stage, then any input enabling the output will have the same effect on the output thus the specific $e_{n-1}$ can be replaced with the generic $E_{n-1}$ which represents any $e_{n-1} \in E_{n-1}$ as shown in equation (14). Equation (14) can then be written as equation (15) according to the associative property. If Property 2 has been verified for the last stage then $\phi E_{n-1} \bar{e}_{n-1}{}^1 = \phi E_{n-1}$ thus $\phi E_{n-1} \bar{e}_{n-1}{}^1$ can be replaced with $\phi E_{n-1}$ as shown in equation (16). This replacing of each $\phi E_{n-1} \bar{e}_{n-1}{}^j$ with $\phi E_{n-1}$ is repeated for each $\bar{e}_{n-1}{}^j$ which results in equation (18).

$$\phi(e_{min}x) = \phi\left(e_{n-1}\bar{e}_{n-1}^1 \ldots \bar{e}_{n-1}^{m_{n-1}} e_{n-2}\bar{e}_{n-2}^1 \ldots \bar{e}_{n-2}^{m_{n-2}} \ldots e_1\bar{e}_1^1 \ldots \bar{e}_1^{m_1} e_0 x\right) \quad (12)$$

$$\phi(e_{min}x) = \quad (13)$$
$$\left(\phi e_{n-1}\left(\bar{e}_{n-1}^1 \ldots \bar{e}_{n-1}^{m_{n-1}} e_{n-2}\bar{e}_{n-2}^1 \ldots \bar{e}_{n-2}^{m_{n-2}} \ldots e_1\bar{e}_1^1 \ldots \bar{e}_1^{m_1} e_0 x\right)\right)$$

$$\phi(e_{min}x) = \quad (14)$$
$$(\phi E_{n-1})\left(\bar{e}_{n-1}^1 \ldots \bar{e}_{n-1}^{m_{n-1}} e_{n-2}\bar{e}_{n-2}^1 \ldots \bar{e}_{n-2}^{m_{n-2}} \ldots e_1\bar{e}_1^1 \ldots \bar{e}_1^{m_1} e_0 x\right)$$

$$\phi(e_{min}x) = \quad (15)$$
$$\left(\phi E_{n-1}\bar{e}_{n-1}^1\right)\left(\ldots \bar{e}_{n-1}^{m_{n-1}} e_{n-2}\bar{e}_{n-2}^1 \ldots \bar{e}_{n-2}^{m_{n-2}} \ldots e_1\bar{e}_1^1 \ldots \bar{e}_1^{m_1} e_0 x\right)$$

$$\left(\phi(e_{min}x) = (\phi E_{n-1})\left(\ldots \bar{e}_{n-1}^{m_{n-1}} e_{n-2}\bar{e}_{n-2}^1 \ldots \bar{e}_{n-2}^{m_{n-2}} \ldots e_1\bar{e}_1^1 \ldots \bar{e}_1^{m_1} e_0 x\right)\right) \quad (16)$$

$$\vdots$$

$$\phi(e_{min}x) = \left(\phi E_{n-1}\bar{e}_{n-1}^{m_{n-1}}\right)\left(e_{n-2}\bar{e}_{n-2}^1 \ldots \bar{e}_{n-2}^{m_{n-2}} \ldots e_1\bar{e}_1^1 \ldots \bar{e}_1^{m_1} e_0 x\right) \quad (17)$$

$$\phi(e_{min}x) = (\phi E_{n-1})\left(e_{n-2}\bar{e}_{n-2}^1 \ldots \bar{e}_{n-2}^{m_{n-2}} \ldots e_1\bar{e}_1^1 \ldots \bar{e}_1^{m_1} e_0 x\right) \quad (18)$$

Properties 1 and 2 are then proved for each previous stage under the assumption that Properties 1 and 2 have been proven for the subsequent stages. Specifically, they can be proven for only one set of inputs wherein each of the subsequent stages are enabled. A generic description of Properties 1 and 2 for the $(n-i)^{th}$ stage is now provided.

Property 1—(Block 304)—($(n-i)^{th}$ stage): The output of an instantiation of the hardware design is the same if the instantiation is in the same state ($x \in X$) when the $(n-i)^{th}$ stage is enabled by any set of inputs (i.e. any $e_{n-1} \in E_{n-1}$) and the subsequent stages are enabled in subsequent cycles by a minimal sequence of inputs. Where the minimal sequence of inputs enables the subsequent stages in successive cycles this can be expressed using equation (19).

$$\phi E_{n-1} \ldots E_{n-i-1}(e_{n-i}x) = \phi E_{n-1} \ldots E_{n-i-1}(e'e_{n-i}x)$$
$$\text{for all } x \in X \text{ and for all } e_{n-i}, e'_{n-i} \in E_{n-i} \quad (19)$$

Verifying Property 1 for the $(n-i)^{th}$ stage verifies that the only input that matters for the $(n-i)$th stage is the input enabling that stage.

Property 2 (Block 306)—($(n-i)^{th}$ stage): That the output of an instantiation of the hardware design if the instantiation is in a particular state ($x \in X$) when the $(n-i)^{th}$ stage is enabled and the subsequent stages are enabled in subsequent cycles by a minimal sequence of inputs is the same as the output of the instantiation if the instantiation is in that particular state when the $(n-1)^{th}$ stage is stalled, the $(n-i)^{th}$ stage is enabled in the next cycle, and the subsequent stages are enabled in subsequent cycles by the minimal sequence of inputs. Where the minimal sequence of inputs enables the subsequent stages in successive cycles this can be expressed using equation (20).

$$\phi E_{n-1} \ldots E_{n-i}(x) = \phi E_{n-1} \ldots E_{n-i}(\bar{e}_{n-i}x) \text{ for all } x \in X$$
$$\text{and for all } \bar{e}_{n-i} \in \bar{E}_{n-i} \cap \bar{E}_{n-i-1} \quad (20)$$

Once Properties 1 and 2 have been proven for the second to last stage (i.e. $(n-2)^{th}$ stage) then in the same way that $\phi e_{n-1} \bar{e}_{n-1}^1 \ldots \bar{e}_{n-1}^{m_{n-1}}$ was replaced with $\phi E_{n-1}$, $\phi E_{n-1} e_{n-2} \bar{e}_{n-2}^1 \ldots \bar{e}_{n-2}^{m_{n-2}}$ can be replaced with $\phi E_{n-1} E_{n-2}$ so that equation (18) can be written as equation (21). Once Properties 1 and 2 have been proven for all of the stages (except the first stage) then equation (21) can be written as equation (22).

$$\phi(e_{min}x) = (\phi E_{n-1} E_{n-2})\left(\ldots e_1 \bar{e}_1^1 \ldots \bar{e}_1^{m_1} e_0 x\right) \quad (21)$$

$$\phi(e_{min}x) = \phi E_{n-1} E_{n-2} \ldots E_1 e_0 x \quad (22)$$

Accordingly, if Properties 1 and 2 have been proven for all of the stages (except the first stage) of the multi-stage component defined by the hardware design then the hardware component is stall independent. This then completes the proof of the core argument—that verifying properties 1 and 2 for all of the stages (except the first stage) of the multi-stage component defined by the hardware design verifies that the hardware component is stall independent.

Addressing False Negatives Based on Design Implementation

Verifying Properties 1 and 2 will not result in false positives—i.e. Properties 1 and 2 will not be verified to be true for a hardware design that is not stall independent—however, in some cases there may be false negatives—i.e. at least one of Properties 1 and 2 may fail the verification, but the hardware design may in fact be stall independent. An example where this may occur is a multi-stage component that takes an input and copies it to multiple places that are progressed through the stages separately.

Let F be a three-stage component which receives, in addition to the enable signal, two inputs a and b, wherein a is a non-negative integer (i.e. $a \in \mathbb{N}$) and b can be 0 or 1, and outputs f(a) if b=0 and f(a)+g(a) if b=1. In the first stage (stage 0) the input b is copied to registers b_top and b_bot.

In the second stage (stage 1) F_top is calculated as f(a) and F_bot is calculated as g(a)*b_bot. In the third stage (stage 2) F_top+F_bot is output.

Figure 10:
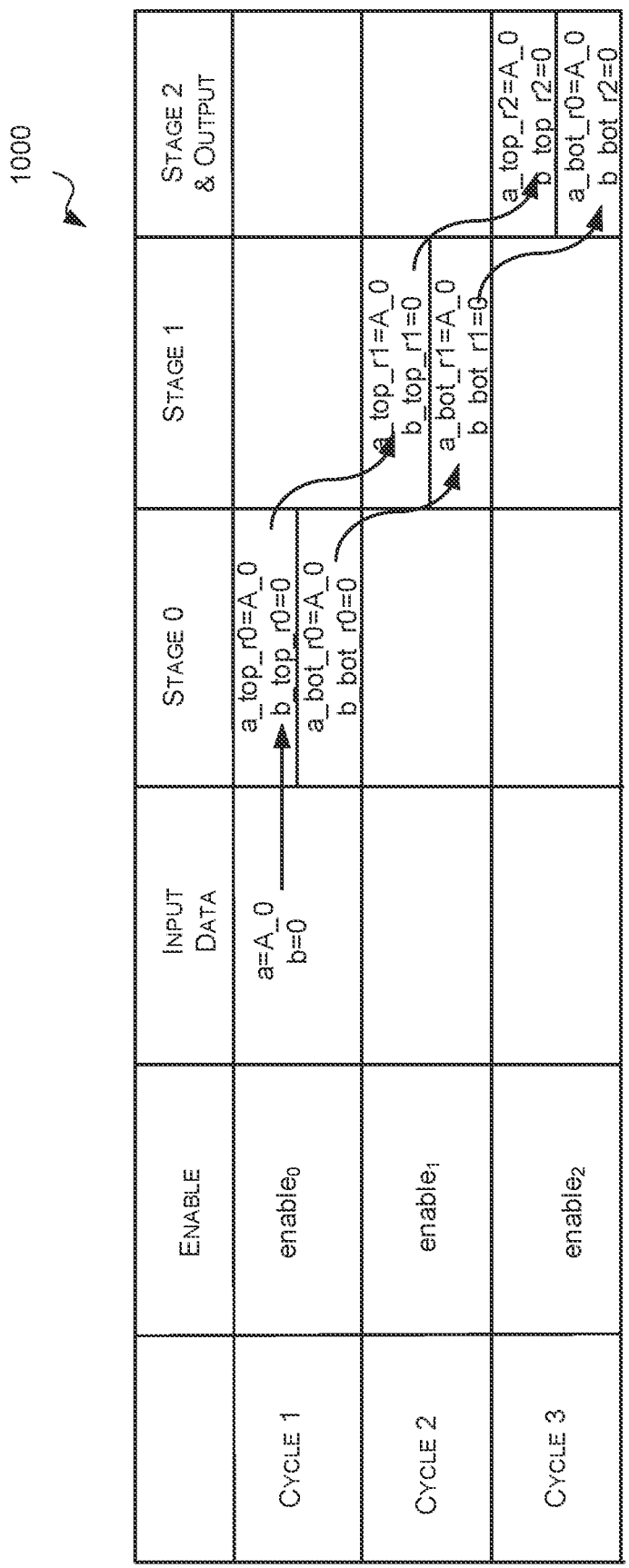
FIG. 10 is a chart illustrating the flow of data through an example multi-stage component that copies data to multiple places.

FIG. 10 illustrates, at 1000, component F receiving sequential enable signals and copying the data along into registers indexed by "rK" wherein K is the stage number. If an instantiation of the hardware design for component F was behaving as expected, then Properties 1 and 2 would be verified for the hardware design for all x∈X regardless of how X is selected. This is because regardless of the initial state of the component, for the same initial state, the component (when operating as expected) will produce the same output. This is true even if the initial state of the component is one which cannot be achieved by processing a valid input. Specifically, for any valid input, registers b_top_rK and b_bottom_rK should be the same. However, since the verification is performed for all states x∈X wherein X ⊂ Ω and Ω is the set of all states (not just the states that can be achieved by processing valid inputs) X may include states that may not be validly achieved. For example, X may include states wherein b_top_r0 is not the same as b_bottom_r0. However, if the component is working as expected the properties will still be verified for all X even if X includes a state where b_top_r0 is not the same as b_bottom_r0. Specifically, if the component is in a state wherein b_top_r0 is not the same as b_bottom_r0 when the second and third stages are enabled in successive cycles, even though the output may not make sense it will still be the same when the component starts in the same state. As noted above, preferably X is selected to include the set of states reached by processing valid inputs but in many cases it may difficult to identify that set of states so X is often is a superset of the states that the component can be in by processing valid inputs.

If, however, the design for component F were modified so that the second stage (stage 1) is configured to set F_top=f(a) and set F_bot to g(a) if b_bot=0 otherwise set F_bot to be anything; and the third stage (stage 2) is configured to output F_top if b_top=0, otherwise output F_top+F_bot. Although this modified design is in fact stall independent for valid inputs Properties 1 and 2 may fail for this modified design for some x in X. For example, if the multi-stage component is in a state wherein b_top_r0=1 and b_bot_r0=0 (which is a valid state in X) when the second stage (stage 1) is enabled (i.e. $e_1 \in E_1$), the register F_bot can be set to any value in the second stage (stage 1) because b_bot is set to zero, but when the third stage (stage 2) is enabled (i.e. $e_2 \in E_2$) the output of the F_top+F_bot may be anything since b_top is set to one.

An issue like this may be addressed in some cases by narrowing X. For example, in this case this can be addressed by limiting X to {x∈Ω|b_top_r0=b_bot_r0, b_top_r1=b_bot_r1 and b_top_r2=b_bot_r2} because for all x in this X the component (when operating as expected) will always produce the same results when it starts in the same state.

Addressing Irrelevant Outputs

As described above in reference to FIGS. 7 and 8, in some cases, some designs have operating modes where not all of the outputs are relevant. For example, as described above, in some cases which portion of the output data is relevant may be based on the inputs. Where the information indicating what portion of the output data is relevant is available in a register associated with the last stage (e.g. there is a register in the last stage storing the b value in the examples of FIGS. 7 and 8) that register can easily be read along with the data to determine what portion of the output data is relevant and the rest of the output data can be ignored. Where, however, there is not a register associated with the final stage that includes that information (e.g. there is no register in the last stage storing the b value in the examples of FIGS. 7 and 8) then the relevant information may have to be accessed from a previous cycle. In these more complicated cases, a new evaluation map ψ is defined as shown in equation (23):

$$\psi: E \times X \to Y \quad (23)$$

The advantage of ψ is that it has access to the state of the component before and after it has processed its final set of inputs. Specifically, where φ determines the outputs of the component for state x, ψ determines the outputs of the component after inputs e have been processed, starting from state x. So in the example of FIGS. 7 and 8 ψ can 'see' x before the component processes the last set of inputs, so ψ knows the values of b before the value of b is lost, and then, based on the value of b, the second output g(a) may be marked as junk, or set to zero.

Properties 1 and 2 can then be reformulated based on ψ. Where ψ only depends on ex, then ψ(e,x)=φ(ex). For this more complicated case Property 1 can be replaced with the property expressed in equation (24) and Property 2 can be replaced with the property expressed in equation (25):

$$\psi(E_{n-1}, E_{n-2} \ldots E_{n-i+1} e_{n-i}, x) = \psi(E_{n-1}, E_{n-2} \ldots E_{n-i+1} e'_{n-i}, x) \text{ for all } x \in X \text{ and } e_{n-i}, e'_{n-i} \in E_{n-i} \quad (24)$$

$$\psi(E_{n-1}, E_{n-2} \ldots E_{n-i}, x) = \psi(E_{n-1}, E_{n-2} \ldots E_{n-i} \bar{e}_{n-i}, x') \text{ for all } \in X \text{ and } \bar{e}_{n-i} \in \bar{E}_{n-i} \cap \bar{E}_{n-i} - 1 \quad (25)$$

A design for a multi-stage component would then be stall independent if any minimal sequence of inputs starting with $e_0$ and ending with $e_{n-1}$ has that $\psi(e_{n-1}, ex)$ depends only on $e_0$ and x.

If, however, further stages of information are required then the number of inputs from E that ψ takes can be expanded. The most extreme case being as shown in equation (26)

$$\psi: E_{n-1} \times \mathbb{E}_{n-1} \times E_{n-2} \times \mathbb{E}_{n-2} \times \ldots \times \mathbb{E}_1 \times E_0 \times X \to Y \quad (26)$$

wherein $\mathbb{E}_{n-i}$ is a collection of maps X→X which contains the identity (the map which sends every state to itself) $1_X$ and all maps that are of the form $\bar{e}_1^1 \ldots \bar{e}_1^m$ for some m∈ℕ and $\bar{e}_1^j \in \bar{E}_i \cap \bar{E}_{i-1}$ for j=1, ..., m Property 1 can then be replaced with the property expressed in equation (27) and Property 2 can then be replaced with the property expressed in equation (28):

$$\psi(E_{n-1}, 1_X E_{n-2}, \ldots, 1_X e_{n-i} \bar{e}_{n-i} e_{n-i-1}, \ldots, e_0, x) = \psi(E_{n-1}, 1_X E_{n-2}, \ldots 1_X e'_{n-i} \bar{e}_{n-i} e_{n-i-1}, \ldots, e_0, x)$$
$$\text{for all } x \in X \text{ and all } e_j \in E_j, e'_{n-i} \in E_{n-i}, \bar{e}_j \in \mathbb{E}_j \text{ for } j=0, 1, \ldots n-i. \quad (27)$$

$$\psi(E_{n-1}, 1_X E_{n-2}, \ldots, 1_X E_{n-i} \bar{e}_{n-i} e_{n-i-1}, \bar{e}_{n-i-1}, e_0, x) = \psi(E_{n-1}, 1_X E_{n-2}, \ldots, 1_X e_{n-i}, 1_X e_{n-i-1}, \bar{e}_{n-i-1}, \ldots, e_0, x) \text{ for all } x \in X \text{ and all } e_j \in E_j, \bar{e}_j \in \mathbb{E}_j$$
$$\text{for } j=0, 1, \ldots n-i. \quad (28)$$

Property 1 is showing that the map in equation (29) is well defined:

$$\psi E_{n-1} E_{n-2} \ldots E_{n-i}: \mathbb{E}_{n-i} \times E_{n-i-1} \times \mathbb{E}_{n-i-1} \times \ldots \times \mathbb{E}_1 \times E_0 \times X \to Y \quad (29)$$

Property 2 is showing that for the map from Property 1, the $\mathbb{E}_{n-i}$ input can be replaced with $1_X$. The argument then proceeds analogously to equations 12 to 18.

A design for a multi-stage component would then be stall independent if any minimal sequence of inputs, e, has that equation (30) depends only on $e_0 \in E$ and x∈X.

$$\psi(e_{n-1}, \bar{e}_{n-1}^1 \ldots e_{n-1}^{m_{n-1}}, e_{n-2}, \ldots, \bar{e}_1^1, \ldots, \bar{e}_1^{m_1}, e_0, x) \quad (30)$$

Proving these properties is significantly more difficult than Properties 1 and 2 as expressed in equations (10) and (11) and they are dependent on n cycles of inputs which is more computationally complex to verify. However, as each computation takes the entire sequence of inputs form $e_0$ to $e_{n-1}$, there are likely to be less issues with the component starting in an invalid initial state (e.g. a state that would not be reached by processing valid inputs).

Figure 11:
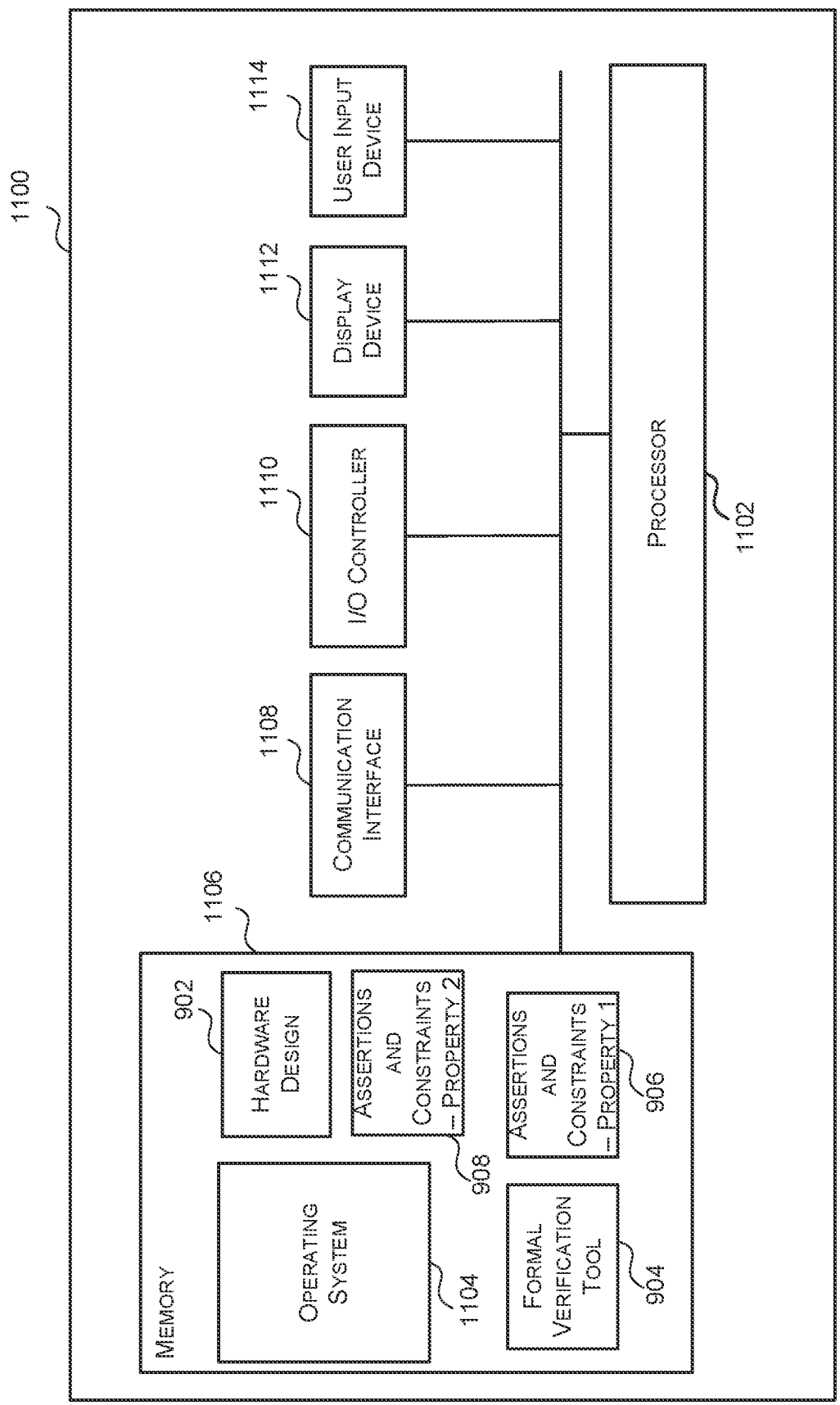
FIG. 11 is a block diagram of an example computing-based device.

FIG. 11 illustrates various components of an exemplary computing-based device 1100 which may be implemented as any form of a computing and/or electronic device, and in which embodiments of the methods and systems described herein may be implemented.

Computing-based device 1100 comprises one or more processors 1102 which may be microprocessors, controllers or any other suitable type of processors for processing computer executable instructions to control the operation of the device in order to verify a property of a hardware design for a multi-stage component. In some examples, for example where a system on a chip architecture is used, the processors 1102 may include one or more fixed function blocks (also referred to as accelerators) which implement a part of the method of verifying a hardware design for a multi-stage component, in hardware (rather than software or firmware). Platform software comprising an operating system 1104 or any other suitable platform software may be provided at the computing-based device to enable application software, such as a formal verification tool 904, to be executed on the device.

The computer executable instructions may be provided using any computer-readable media that is accessible by computing-based device 1100. Computer-readable media may include, for example, computer storage media such as memory 1106 and communications media. Computer storage media (i.e. non-transitory machine readable media), such as memory 1106, includes volatile and non-volatile, removable and non-removable media implemented in any method or technology for storage of information such as computer readable instructions, data structures, program modules or other data. Computer storage media includes, but is not limited to, RAM, ROM, EPROM, EEPROM, flash memory or other memory technology, CD-ROM, digital versatile disks (DVD) or other optical storage, magnetic cassettes, magnetic tape, magnetic disk storage or other magnetic storage devices, or any other non-transmission medium that can be used to store information for access by a computing device. In contrast, communication media may embody computer readable instructions, data structures, program modules, or other data in a modulated data signal, such as a carrier wave, or other transport mechanism. As defined herein, computer storage media does not include communication media. Although the computer storage media (i.e. non-transitory machine readable media, e.g. memory 1106) is shown within the computing-based device 1100 it will be appreciated that the storage may be distributed or located remotely and accessed via a network or other communication link (e.g. using communication interface 1108).

The computing-based device 1100 also comprises an input/output controller 1110 arranged to output display information to a display device 1112 which may be separate from or integral to the computing-based device 1100. The display information may provide a graphical user interface. The input/output controller 1110 is also arranged to receive and process input from one or more devices, such as a user input device 1114 (e.g. a mouse or a keyboard). This user input may be used to initiate verification. In an embodiment the display device 1112 may also act as the user input device 1114 if it is a touch sensitive display device. The input/output controller 1110 may also output data to devices other than the display device, e.g. a locally connected printing device (not shown in FIG. 11).

Figure 12:
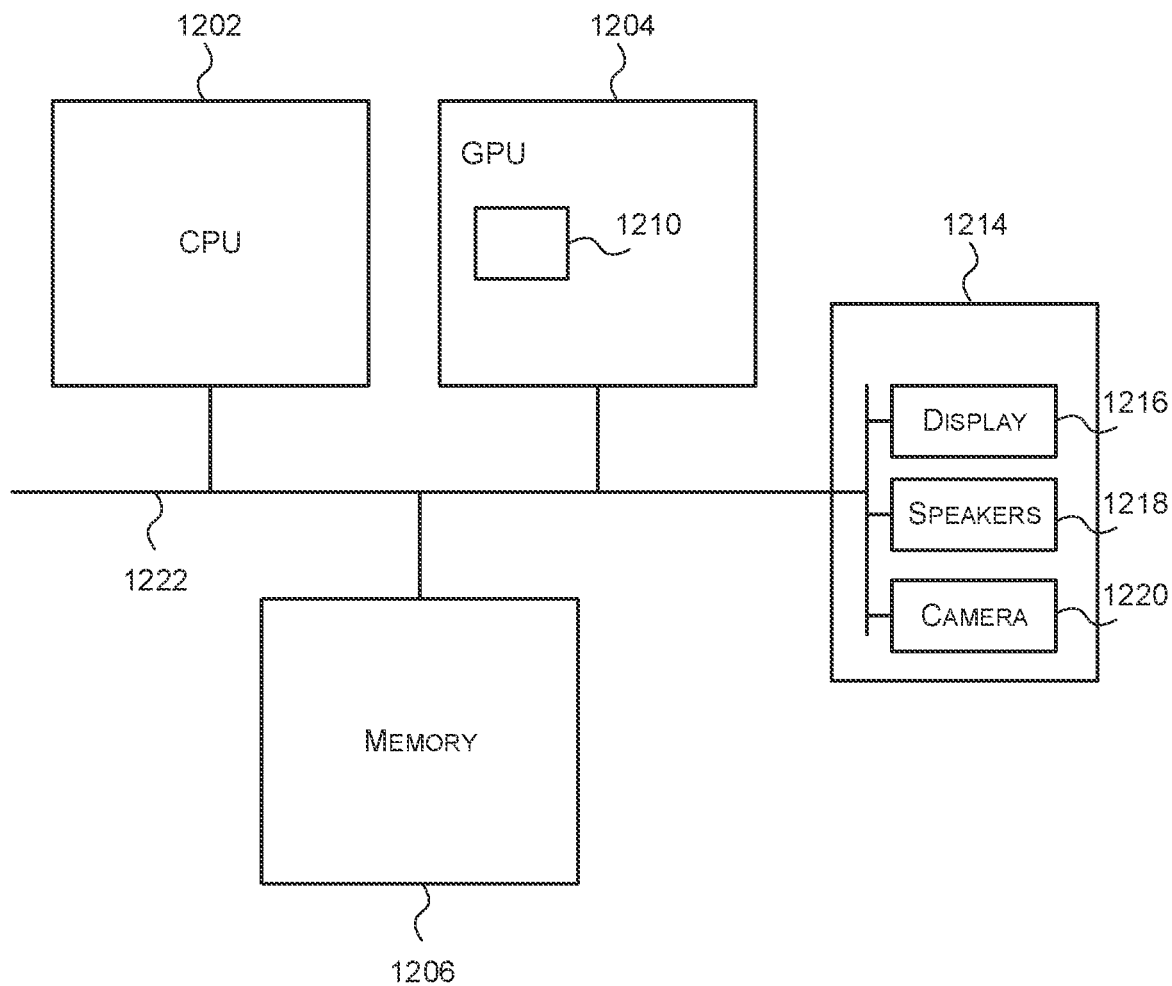
FIG. 12 is a block diagram of an example computer system in which a multi-stage component may be implemented.

FIG. 12 shows a computer system in which a multi-stage component 1210 may be implemented. The computer system comprises a CPU 1202, a GPU 1204, a memory 1206 and other devices 1214, such as a display 1216, speakers 1218 and a camera 1220. In the example of FIG. 12 the GPU 1204 is shown as comprising the multi-stage component 1210. In other examples, the multi-stage component 1210 may be implemented in the CPU 1202. The components of the computer system can communicate with each other via a communications bus 1222.

A multi-stage component described herein may be embodied in hardware on an integrated circuit. Generally, any of the functions, methods, techniques or components described above can be implemented in software, firmware, hardware (e.g., fixed logic circuitry), or any combination thereof. The terms "module," "functionality," "component", "element", "unit", "block" and "logic" may be used herein to generally represent software, firmware, hardware, or any combination thereof. In the case of a software implementation, the module, functionality, component, element, unit, block or logic represents program code that performs the specified tasks when executed on a processor. The algorithms and methods described herein could be performed by one or more processors executing code that causes the processor(s) to perform the algorithms/methods. Examples of a computer-readable storage medium include a random-access memory (RAM), read-only memory (ROM), an optical disc, flash memory, hard disk memory, and other memory devices that may use magnetic, optical, and other techniques to store instructions or other data and that can be accessed by a machine.

The terms computer program code and computer readable instructions as used herein refer to any kind of executable code for processors, including code expressed in a machine language, an interpreted language or a scripting language. Executable code includes binary code, machine code, bytecode, code defining an integrated circuit (such as a hardware description language or netlist), and code expressed in a programming language code such as C, Java or OpenCL. Executable code may be, for example, any kind of software, firmware, script, module or library which, when suitably executed, processed, interpreted, compiled, executed at a virtual machine or other software environment, cause a processor of the computer system at which the executable code is supported to perform the tasks specified by the code.

A processor, computer, or computer system may be any kind of device, machine or dedicated circuit, or collection or portion thereof, with processing capability such that it can execute instructions. A processor may be any kind of general purpose or dedicated processor, such as a CPU, GPU, System-on-chip, state machine, media processor, an application-specific integrated circuit (ASIC), a programmable logic array, a field-programmable gate array (FPGA), or the like. A computer or computer system may comprise one or more processors.

It is also intended to encompass software which defines a configuration of hardware as described herein, such as HDL (hardware description language) software, as is used for designing integrated circuits, or for configuring programmable chips, to carry out desired functions. That is, there may be provided a computer readable storage medium having encoded thereon computer readable program code in the form of an integrated circuit definition dataset (which may also be referred to as a hardware design) that when processed (i.e. run) in an integrated circuit manufacturing system configures the system to manufacture a computing device comprising any apparatus described herein. An integrated circuit definition dataset may be, for example, an integrated circuit description.

Therefore, there may be provided a method of manufacturing, at an integrated circuit manufacturing system, a multi-stage component as described herein. Furthermore, there may be provided an integrated circuit definition dataset that, when processed in an integrated circuit manufacturing system, causes the method of manufacturing a multi-stage component to be performed.

An integrated circuit definition dataset may be in the form of computer code, for example as a netlist, code for configuring a programmable chip, as a hardware description language defining hardware suitable for manufacture in an integrated circuit at any level, including as register transfer level (RTL) code, as high-level circuit representations such as Verilog or VHDL, and as low-level circuit representations such as OASIS® and GDSII. Higher level representations which logically define hardware suitable for manufacture in an integrated circuit (such as RTL) may be processed at a computer system configured for generating a manufacturing definition of an integrated circuit in the context of a software environment comprising definitions of circuit elements and rules for combining those elements in order to generate the manufacturing definition of an integrated circuit so defined by the representation. As is typically the case with software executing at a computer system so as to define a machine, one or more intermediate user steps (e.g. providing commands, variables etc.) may be required in order for a computer system configured for generating a manufacturing definition of an integrated circuit to execute code defining an integrated circuit so as to generate the manufacturing definition of that integrated circuit.

An example of processing an integrated circuit definition dataset (e.g. a hardware design) at an integrated circuit manufacturing system so as to configure the system to manufacture a multi-stage component will now be described with respect to FIG. 13.

Figure 13:
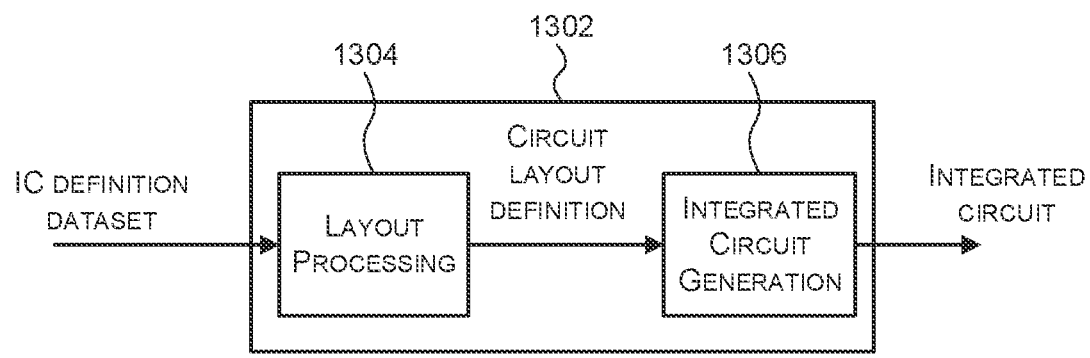
FIG. 13 is a block diagram of an example integrated circuit manufacturing system which may be used to generate an integrated circuit embodying a multi-stage component.

FIG. 13 shows an example of an integrated circuit (IC) manufacturing system 1302 which is configured to manufacture an integrated circuit that embodies a multi-stage component as described in any of the examples herein. In particular, the IC manufacturing system 1302 comprises a layout processing system 1304 and an integrated circuit generation system 1306. The IC manufacturing system 1302 is configured to receive an IC definition dataset/hardware design (e.g. defining a multi-stage component), process the IC definition dataset, and generate an IC according to the IC definition dataset (e.g. which embodies a multi-stage component as described in any of the examples herein). The processing of the IC definition dataset configures the IC manufacturing system 1302 to manufacture an integrated circuit embodying a multi-stage component as described in any of the examples herein.

The layout processing system 1304 is configured to receive and process the IC definition dataset/hardware design to determine a circuit layout. Methods of determining a circuit layout from an IC definition dataset are known in the art, and for example may involve synthesising RTL code to determine a gate level representation of a circuit to be generated, e.g. in terms of logical components (e.g. NAND, NOR, AND, OR, MUX and FLIP-FLOP components). A circuit layout can be determined from the gate level representation of the circuit by determining positional information for the logical components. This may be done automatically or with user involvement in order to optimise the circuit layout. When the layout processing system 1304 has determined the circuit layout it may output a circuit layout definition to the IC generation system 1306. A circuit layout definition may be, for example, a circuit layout description.

The IC generation system 1306 generates an IC according to the circuit layout definition, as is known in the art. For example, the IC generation system 1306 may implement a semiconductor device fabrication process to generate the IC, which may involve a multiple-step sequence of photo lithographic and chemical processing steps during which electronic circuits are gradually created on a wafer made of semiconducting material. The circuit layout definition may be in the form of a mask which can be used in a lithographic process for generating an IC according to the circuit definition. Alternatively, the circuit layout definition provided to the IC generation system 1306 may be in the form of computer-readable code which the IC generation system 1306 can use to form a suitable mask for use in generating an IC.

The different processes performed by the IC manufacturing system 1302 may be implemented all in one location, e.g. by one party. Alternatively, the IC manufacturing system 1302 may be a distributed system such that some of the processes may be performed at different locations, and may be performed by different parties. For example, some of the stages of: (i) synthesising RTL code representing the IC definition dataset to form a gate level representation of a circuit to be generated, (ii) generating a circuit layout based on the gate level representation, (iii) forming a mask in accordance with the circuit layout, and (iv) fabricating an integrated circuit using the mask, may be performed in different locations and/or by different parties.

In other examples, processing of the integrated circuit definition dataset at an integrated circuit manufacturing system may configure the system to manufacture an integrated circuit embodying a multi-stage component without the IC definition dataset being processed so as to determine a circuit layout. For instance, an integrated circuit definition dataset may define the configuration of a reconfigurable processor, such as an FPGA, and the processing of that dataset may configure an IC manufacturing system to generate a reconfigurable processor having that defined configuration (e.g. by loading configuration data to the FPGA).

In some embodiments, an integrated circuit manufacturing definition dataset/hardware design, when processed in an integrated circuit manufacturing system, may cause an integrated circuit manufacturing system to generate a device as described herein. For example, the configuration of an integrated circuit manufacturing system in the manner described above with respect to FIG. 13 by an integrated circuit manufacturing definition dataset may cause a device as described herein to be manufactured.

In some examples, an integrated circuit definition dataset could include software which runs on hardware defined at the dataset or in combination with hardware defined at the dataset. In the example shown in FIG. 13, the IC generation system may further be configured by an integrated circuit definition dataset/hardware design to, on manufacturing an integrated circuit, load firmware onto that integrated circuit in accordance with program code defined at the integrated circuit definition dataset or otherwise provide program code with the integrated circuit for use with the integrated circuit.

The implementation of concepts set forth in this application in devices, apparatus, modules, and/or systems (as well as in methods implemented herein) may give rise to performance improvements when compared with known implementations. The performance improvements may include one or more of increased computational performance, reduced latency, increased throughput, and/or reduced power consumption. During manufacture of such devices, apparatus, modules, and systems (e.g. in integrated circuits) performance improvements can be traded-off against the physical implementation, thereby improving the method of manufacture. For example, a performance improvement may be traded against layout area, thereby matching the performance of a known implementation but using less silicon. This may be done, for example, by reusing functional blocks in a serialised fashion or sharing functional blocks between elements of the devices, apparatus, modules and/or systems. Conversely, concepts set forth in this application that give rise to improvements in the physical implementation of the devices, apparatus, modules, and systems (such as reduced silicon area) may be traded for improved performance. This may be done, for example, by manufacturing multiple instances of a module within a predefined area budget.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein. In view of the foregoing description it will be evident to a person skilled in the art that various modifications may be made within the scope of the invention.

What is claimed is:

1. A method of verifying a hardware design for a multi-stage component is stall independent, the multi-stage component configured to receive input data and generate output data by processing the input data at each of a plurality of successive stages, each stage capable of being enabled or stalled each cycle, the method comprising:
   for each stage of the plurality of stages from the second stage to the last stage:
      verifying, at one or more processors, a first property, the first property being that a relevant portion of the output data of an instantiation of the hardware design is the same if the instantiation is in the same state when that stage is enabled in a cycle by any set of inputs and any subsequent stages are enabled in subsequent cycles by a first minimal sequence of inputs, and
      verifying, at the one or more processors, a second property, the second property being that the relevant portion of the output data of an instantiation of the hardware design is the same if the instantiation is in the same state (i) when that stage is enabled in a cycle and any subsequent stages are enabled in subsequent cycles by a second minimal sequence of inputs and (ii) when that stage is stalled, then that stage is enabled in a next cycle, and the subsequent stages are enabled in subsequent cycles by the second minimal sequence of inputs;
   in response to determining that at least one of the verifications was not successful indicating that an instantiation of the hardware design is not stall independent, outputting, at the one or more processors, information which causes a user to modify the hardware design to correct an error in the hardware design that caused the at least one verification to fail; and
   in response to determining that the verifications were successful, manufacturing, using an integrated circuit manufacturing system, an integrated circuit embodying the multi-stage component according to the hardware design.

2. The method of claim 1, wherein the second property is verified for a stage under a constraint that when the stage is stalled in a cycle that a stage preceding that stage is also stalled.

3. The method of claim 1, wherein the relevant portion of the output data is all of the output data, or wherein the relevant portion of the output data is based on the input to the multi-stage component and/or an operating mode of the multi-stage component.

4. The method of claim 1, further comprising, verifying that the hardware design is independent of initial state by verifying that the output data of an instantiation of the hardware design is the same for the same input data when the stages are enabled by a minimal sequence of inputs regardless of an initial state of the instantiation of the hardware design.

5. The method of claim 1, wherein the first property is verified for a stage for each possible valid state of the multi-stage component.

6. The method of claim 1, wherein the first property is verified for a stage for each possible set of inputs to the multi-stage component in which the stage is enabled.

7. The method of claim 1, wherein at least one of the first property and the second property is verified for a stage for only one minimal sequence of inputs.

8. The method of claim 1, wherein the second property is verified for a stage for each possible valid state of the multi-stage component.

9. The method of claim 1, wherein the second property is verified for a stage for each possible set of inputs in which the stage is stalled.

10. The method of claim 1, wherein a minimal sequence of inputs for the subsequent stages is a sequence of inputs which progress a same input through each of the subsequent stages.

11. The method of claim 1, wherein the first and/or second minimal sequence of inputs comprises a sequence of inputs in which the subsequent stages are enabled in successive cycles.

12. The method of claim 1, further comprising outputting one or more signals indicating whether the verifications were successful.

13. The method of claim 1, further comprising the user modifying the hardware design.

14. The method of claim 1, further comprising re-verifying the modified hardware design.

15. The method of claim 1, wherein at least one of the first property and the second property is formally verified using a formal verification tool.

16. The method of claim 15, wherein formally verifying the at least one of the first property and the second property comprises formally verifying one or more assertions under one or more constraints.

17. The method of claim 1, wherein the information which causes the user to modify the hardware design comprises a state or sequence of states of the hardware design which causes the at least one verification to fail.

18. A system for verifying that a hardware design for a multi-stage component is stall independent, the system comprising:

memory comprising:
- the hardware design for the multi-stage component, the component configured to receive input data and generate output data by processing the input data at each of a plurality of successive stages, each stage capable of being enabled or stalled each cycle, and
- one or more verification tools; and one or more processors configured to:
- for each stage of the plurality of stages from the second stage to the last stage:
  - verify a first property using one or more of the verification tools, the first property being that a relevant portion of the output data of an instantiation of the hardware design is the same if the instantiation is in the same state when that stage is enabled in a cycle by any set of inputs and any subsequent stages are enabled in subsequent cycles by a first minimal sequence of inputs, and
  - verify a second property using one or more of the verification tools, the second property being that the relevant portion of the output data of an instantiation of the hardware design is the same if the instantiation is in the same state (i) when that stage is enabled in a cycle and any subsequent stages are enabled in subsequent cycles by a second minimal sequence of inputs and (ii) when that stage is stalled, then that stage is enabled in a next cycle and the subsequent stages are enabled in subsequent cycles by the second minimal sequence of inputs;
- in response to determining that at least one of the verifications was not successful indicating that an instantiation of the hardware design is not stall independent, output information which causes a user to modify the hardware design to correct an error in the hardware design which caused the at least one verification to fail; and
- in response to determining that the verifications were successful, cause an integrated circuit manufacturing system to manufacture an integrated circuit embodying the multi-stage component according to the hardware design.

19. A non-transitory computer readable storage medium having stored thereon computer readable instructions that, when executed at a computer system, cause the computer system to perform the method as set forth in claim 1.

* * * * *